United States Patent
Shrivastava

(10) Patent No.: US 12,525,963 B2
(45) Date of Patent: Jan. 13, 2026

(54) ULTRA-LOW POWER TIMING CIRCUIT WITH PLL LOCKING

(71) Applicant: Northeastern University, Boston, MA (US)

(72) Inventor: Aatmesh Shrivastava, Weston, MA (US)

(73) Assignee: Northeastern University, Boston, MA (US)

( * ) Notice: Subject to any disclaimer, the term of this patent is extended or adjusted under 35 U.S.C. 154(b) by 0 days.

(21) Appl. No.: 18/825,616

(22) Filed: Sep. 5, 2024

(65) Prior Publication Data

US 2025/0088177 A1    Mar. 13, 2025

Related U.S. Application Data

(60) Provisional application No. 63/537,364, filed on Sep. 8, 2023.

(51) Int. Cl.
*H03K 3/011* (2006.01)
*H03K 5/135* (2006.01)
*H03L 7/099* (2006.01)

(52) U.S. Cl.
CPC .......... *H03K 3/011* (2013.01); *H03K 5/135* (2013.01); *H03L 7/099* (2013.01)

(58) Field of Classification Search
CPC ...................................................... H03K 3/011
USPC ........................................................ 331/176
See application file for complete search history.

(56) References Cited

U.S. PATENT DOCUMENTS

| | | | | |
|---|---|---|---|---|
| 6,522,871 B1 * | 2/2003 | Patrick | ............. | H03J 7/04 455/256 |
| 7,015,762 B1 * | 3/2006 | Nicholls | ............. | H03L 1/00 331/10 |
| 7,228,117 B2 * | 6/2007 | Ichihara | ............. | H03L 1/026 455/259 |
| 7,764,133 B1 * | 7/2010 | Nicholls | ............. | H03L 1/04 331/44 |
| 2002/0079975 A1 * | 6/2002 | Asikainen | ............. | H03L 7/099 331/17 |
| 2022/0278688 A1 * | 9/2022 | Jaeschke | ............. | G01S 7/352 |

* cited by examiner

Primary Examiner — Joseph Chang
(74) Attorney, Agent, or Firm — Foley Hoag LLP; Dana M. Gordon; Erik A. Huestis

(57) ABSTRACT

Methods, systems, and computer program products are presented herein for circuit timing using ultra-low power (ULP) timing circuit systems. A ULP timing circuit system comprises a receiver circuit, phase lock loop (PLL) circuit, crystal oscillator (XO) circuit, temperature sensing and calibration circuit, and temperature compensation circuit. The receiver circuit is configured to receive a reference clock signal. The XO circuit is configured to produce an output clock signal. The PLL circuit is configured to produce a control signal based on the reference clock signal and output clock signal. The temperature compensation circuit is configured to produce a compensation signal based on an operating temperature. The temperature sensing and calibration circuit is configured to sense the operating temperature and to calibrate the XO circuit based on the operating temperature, control signal, and compensation signal to lock a frequency of the output clock signal to the reference clock signal.

20 Claims, 26 Drawing Sheets

| | Average (Mag) | Ibias Nominal R^2=0.90802 (Top 1000.0%) |
|---|---|---|
| I0.M15:par4p_25 | 18% | 18% |
| I0.M14:par4p_25 | 17% | 17% |
| I0.M9:par4n_25 | 13% | 13% |
| I0.M2:par4p_25 | 12% | 12% |
| I0.M8:par4n_25 | 12% | 12% |
| I0.M0:par4p_25 | 8% | 8% |
| I0.M14:par1p_25 | 7% | 7% |
| I0.M15:par1p_25 | 7% | 7% |
| I0.M2:par1p_25 | 6% | 6% |
| I0.C0:parmvar_25 | 0% | 0% |
| I0.C1:parmvar_25 | 0% | 0% |
| I0.C4:par_mim | 0% | 0% |
| I0.M0:par1p_25 | 0% | 0% |

FIG. 10B

ULTRA-LOW POWER TIMING CIRCUIT WITH PLL LOCKING

CROSS REFERENCE TO RELATED APPLICATIONS

This application claims the benefit of priority to U.S. Provisional Patent Application No. 63/537,364, filed Sep. 8, 2023; which is hereby incorporated by reference herein in its entirety.

STATEMENT AS TO FEDERALLY SPONSORED RESEARCH

This invention was made with government support under Grant No. FA8649-21-P-1475 awarded by the Air Force Research Laboratories. The government has certain rights in the invention.

BACKGROUND

Field of the Disclosed Subject Matter

The disclosed subject matter relates to ultra-low power timing circuits. Particularly, the present disclosed subject matter is directed to ultra-low power timing circuits with phase lock loop (PLL) circuits.

Description of Related Art

Timing circuit systems are used in a wide range of applications across various industries. Key aspects of timing circuit systems are their ability to maintain precise clocks and ensure high stability in the presence of environmental variations, such as fluctuations in temperature and supply voltage. For instance, crystal oscillators (XOs), commonly used in timing circuits, are highly sensitive to temperature fluctuations. Variations in temperature can cause the resonant frequency of these oscillators to drift, leading to timing errors that can significantly impact system performance, especially in applications requiring high precision such as telecommunications and GPS systems. Hence, there is a need for an ultra-low power (ULP) timing circuit system that overcomes these challenges.

SUMMARY OF THE DISCLOSED SUBJECT MATTER

The purpose and advantages of the disclosed subject matter will be set forth in and apparent from the description that follows, as well as will be learned by practice of the disclosed subject matter. Additional advantages of the disclosed subject matter will be realized and attained by the methods and systems particularly pointed out in the written description and claims hereof, as well as from the appended drawings.

To achieve these and other advantages in accordance with the purpose of the disclosed subject matter, as embodied and broadly described, the disclosed subject matter includes an ultra-low power (ULP) timing circuit system comprising a receiver circuit, a phase lock loop (PLL) circuit, a crystal oscillator (XO) circuit, a temperature sensing and calibration circuit, and a temperature compensation circuit. The PLL circuit is electrically coupled between the receiver circuit and the XO circuit. The temperature sensing and calibration circuit is electrically coupled to the PLL circuit and the XO circuit. The temperature compensation circuit is electrically coupled to the temperature sensing and calibration circuit. The receiver circuit is configured to receive a reference clock signal, and to provide the reference clock signal to the PLL circuit. The XO circuit is configured to produce an output clock signal, and to provide the output clock signal to the PLL circuit. The PLL circuit is configured to produce a control signal based on the reference clock signal and the output clock signal, and to provide the control signal to the temperature sensing and calibration circuit. The temperature compensation circuit is configured to produce a compensation signal based on an operating temperature, and to provide the compensation signal to the temperature sensing and calibration circuit. The temperature sensing and calibration circuit is configured to sense the operating temperature and to calibrate the XO circuit based on the operating temperature, the control signal, and the compensation signal to lock a frequency of the output clock signal to the reference clock signal.

The receiver circuit may comprise a GPS receiver circuit and an antenna. The PLL circuit may comprise a phase frequency detector. The phase frequency detector may be configured to compare the reference clock signal and the output clock signal. The phase frequency detector may be configured to produce the control signal based on the comparison of the reference clock signal and the output clock signal. The phase frequency detector may be configured to provide the control signal to the temperature sensing and calibration circuit. The XO circuit may comprise an analog amplifier electrically coupled in parallel to a resistor and an XTAL. The analog amplifier may be biased sub-threshold. The XO circuit may comprise analog amplifier electrically coupled to an on-chip oscillator. The analog amplifier may be biased sub-threshold. The XO circuit may comprise a voltage-controlled oscillator (VCO). The temperature sensing and calibration circuit may comprise a plurality of varactors electrically coupled to the XO circuit, the PLL circuit, and the temperature compensation circuit. At least a first two of the plurality of varactors may be configured to produce a first XO control signal based on the temperature compensation signal. At least a second two of the plurality of varactors may be configured to produce a second XO control signal based on the control signal. The XO circuit may be further configured to adjust the output clock signal based on the first XO control signal and the second XO control signal. The temperature compensation circuit may comprise a bandgap reference circuit, an analog temperature sensor, and a voltage conditioning circuit. The bandgap reference circuit, the analog temperature sensor, and the voltage conditioning circuit may be electrically coupled in series. The compensation signal may comprise a thermal voltage. The analog temperature sensor may comprise a proportional to absolute temperature (PTAT) current source. The PTAT current source may be configured to generate a PTAT current that varies with a temperature. A switched-capacitor converter may be electrically coupled to the PTAT current source. The switched-capacitor converter may be configured to generate an analog voltage signal based on the PTAT current.

The disclosed subject matter also includes a method for circuit timing. A reference clock signal is received by a receiver circuit. The reference clock signal is provided by the receiver circuit to a phase lock loop (PLL) circuit. An output clock signal is produced by a crystal oscillator (XO) circuit. The output clock signal is provided by the XO circuit to the PLL circuit. A control signal based on the reference clock signal and the output clock signal is produced by the PLL circuit. The control signal is provided by the PLL circuit to a temperature sensing and calibration circuit. A compensation signal based on an operating temperature is produced by a temperature compensation circuit. The compensation signal is provided by the temperature compensation circuit to the temperature sensing and calibration circuit. The operating temperature is sensed by the temperature sensing and calibration circuit. The XO circuit is calibrated by the temperature sensing and calibration circuit based on the on the operating temperature, the control signal, and the compensation signal, to lock a frequency of the output clock signal to the reference clock signal. The PLL circuit is electrically coupled between the receiver circuit and the XO circuit. The temperature sensing and calibration circuit is electrically coupled to the PLL circuit and the XO circuit. The temperature compensation circuit is electrically coupled to the temperature sensing and calibration circuit.

The receiver circuit may comprise a GPS receiver circuit and an antenna. The PLL circuit may comprise a phase frequency detector. The reference clock signal and the output clock signal may be compared by the phase frequency detector. The control signal based on the comparison of the reference clock signal and the output clock signal may be produced by the phase frequency detector. The control signal may be provided by the phase frequency detector to the temperature sensing and calibration circuit. The XO circuit may comprise an analog amplifier electrically coupled in parallel to a resistor and an XTAL. The analog amplifier may be biased sub-threshold. The XO circuit may comprise an analog amplifier electrically coupled to an on-chip oscillator. The analog amplifier may be biased sub-threshold. The XO circuit may comprise a voltage-controlled oscillator (VCO). The temperature sensing and calibration circuit may comprise a plurality of varactors electrically coupled to the XO circuit, the PLL circuit, and the temperature compensation circuit. A first XO control signal based on the temperature compensation signal may be produced by at least a first two of the plurality of varactors. A second XO control signal based on the control signal may be produced by at least a second two of the plurality of varactors. The output clock signal based on the first XO control signal and the second XO control signal may be adjusted by the XO circuit. The temperature compensation circuit may comprise a bandgap reference circuit, an analog temperature sensor, and a voltage conditioning circuit. The bandgap reference circuit, the analog temperature sensor, and the voltage conditioning circuit may be electrically coupled in series. The compensation signal may comprise a thermal voltage. The analog temperature sensor may comprise a proportional to absolute temperature (PTAT) current source and a switched-capacitor converter electrically coupled to the PTAT current source. A PTAT current that varies with a temperature may be generated by the PTAT current source. An analog voltage signal based on the PTAT current may be generated by the switched-capacitor converter.

It is to be understood that both the foregoing general description and the following detailed description are exemplary and are intended to provide further explanation of the disclosed subject matter claimed.

The accompanying drawings, which are incorporated in and constitute part of this specification, are included to illustrate and provide a further understanding of the method and system of the disclosed subject matter. Together with the description, the drawings explain the principles of the disclosed subject matter.

BRIEF DESCRIPTION OF THE DRAWINGS

A detailed description of various aspects, features, and embodiments of the subject matter described herein is provided with reference to the accompanying drawings, which are briefly described below. The drawings are illustrative and are not necessarily drawn to scale, with some components and features being exaggerated for clarity. The drawings illustrate various aspects and features of the present subject matter and may illustrate one or more embodiment(s) or example(s) of the present subject matter in whole or in part.

FIG. 2B depicts an equivalent circuit model of the crystal oscillator circuit shown in FIG. 2A.

FIG. 4A depicts an illustrative graph of crystal reactance of a crystal in a crystal oscillator circuit as a function of frequency. FIG. 4B depicts an illustrative graph of frequency as a function of temperature of a crystal oscillator.

FIG. 10B shows a table summarizing bias current performance across various electronic components shown in FIG. 10A.

DETAILED DESCRIPTION

Figure 1A:
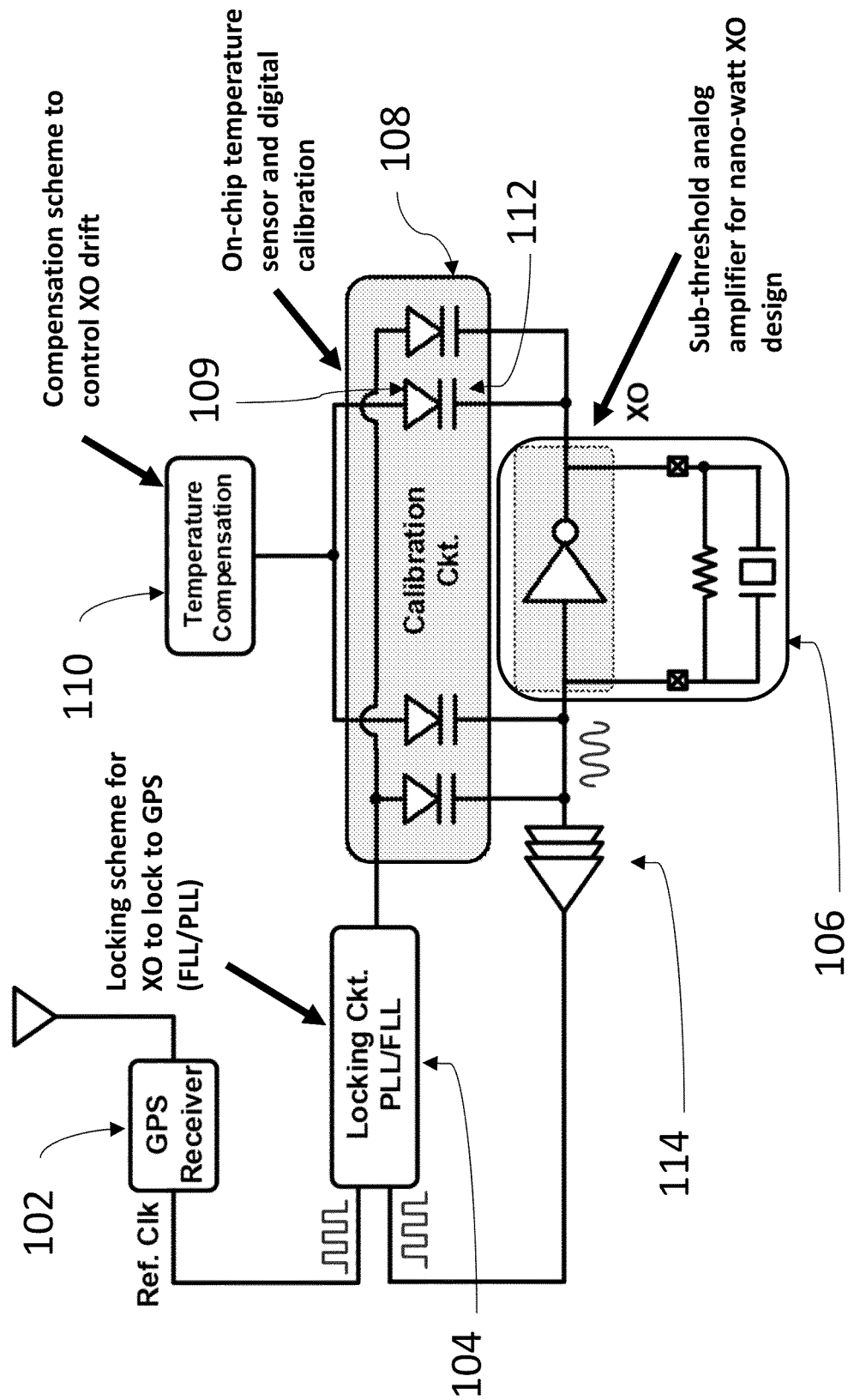
FIG. 1A depicts an ultra-low power (ULP) timing circuit system according to various embodiments of the present disclosure.

Reference will now be made in detail to exemplary embodiments of the disclosed subject matter, an example of which is illustrated in the accompanying drawings. The method and corresponding steps of the disclosed subject matter will be described in conjunction with the detailed description of the system.

For purpose of explanation and illustration, and not limitation, exemplary embodiments of the system in accordance with the disclosed subject matter are shown in the Figures presented herein. Similar reference numerals (differentiated by the leading numeral) may be provided among the various views and Figures presented herein to denote functionally corresponding, but not necessarily identical structures.

Various embodiments disclosed herein relate an ultra-low power timing circuit system with PLL locking, which provides a precision clock solution. At the core of the clocking architecture is a crystal oscillator (XO). A phase locked loop (PLL) circuit can lock the frequency of an XO to that of an external precise reference clock. The XO can operate as a voltage-controlled oscillator (VCO) by utilizing varactors. The control voltage of the varactor can be used for controlling the output frequency of the XO. The output clock of the XO can be supplied to a phase frequency detector (PFD), which can be used for comparing the output clock with a reference clock. The difference between the output clock and reference clock can be used in PLL architecture to control the VCO and generate a locked clock output.

The disclosed subject matter offers several advantages, including the ability to lock the XO frequency using voltage control and improving clock stability by several orders of magnitude.

Potential uses of the disclosed subject matter include navigation in GPS-denied environments, improved timing circuits for on-chip applications, and integration into wearables and the IoT devices.

The disclosed subject matter offers performance and cost advantages by providing a low-cost, low-power on-chip solution. This contrast with current solutions, which consume relatively more power and can require large batteries.

In accordance with various embodiments, FIG. 1A illustrates the architecture of an ultra-low power (ULP) timing circuit system. A ULP timing circuit system can include a receiver 102, a phase lock loop circuit (PLL) 104, a crystal oscillator (XO) circuit 106, a temperature sensing and calibration circuit 108, and a temperature compensation circuit 110. A PLL circuit is a feedback control system that can synchronize the phase of an output signal with the phase of a reference signal. The PLL circuit 104 can be electrically coupled between the receiver circuit 102 and the XO circuit 106. The temperature sensing and calibration circuit 108 can be electrically connected to the PLL circuit 104 and the XO circuit 106. The temperature compensation circuit 110 can be electrically connected to the temperature sensing and calibration circuit 108. The receiver circuit 102 can include a communication signal receiver and antenna, such as a GPS receiver circuit and an antenna. The receiver circuit 102 can be configured to receive a reference clock signal. The receiver circuit 102 can provide the reference clock signal to the PLL circuit 104.

The XO circuit 106 can be configured to produce an output clock signal. The XO circuit 106 can include a voltage-controlled oscillator (VCO). The XO circuit 106 can generate an output clock signal and provide the output clock signal to the PLL circuit 104. The PLL circuit 104 can be configured to produce a control signal based on the reference clock signal and the output clock signal. Within the PLL circuit 104, the reference clock signal can be compared to the output clock signal. This comparison can be performed by a phase frequency detector included in the PLL circuit 104, which can measure differences in phase or frequency between the reference clock signal and the output clock signal. In various embodiments, the resulting error signal from the comparison can reflect how much the output clock signal needs to be adjusted to synchronize with the reference clock signal and the resulting error signal can serve as a control signal. In various embodiments, the resulting error signal from the comparison can be further processed by a loop filter to smooth out any noise (e.g., high-frequency noise) and/or adjust response characteristics; this filtered error signal can serve as a control signal. The control signal can be used to regulate the output frequency of the XO circuit 106. The XO circuit 106 can be configured to adjust the output frequency based on the control signal.

The PLL circuit 104 can provide the control signal to the temperature sensing and calibration circuit 108. The temperature compensation circuit 110 can be configured to produce a compensation signal based on an operating temperature and provide the compensation signal to the temperature sensing and calibration circuit 108. This compensation signal can account for temperature-induced variations in the oscillator's frequency. The temperature sensing and calibration circuit 108 can receive both the control signal, from PLL circuit 104, and the compensation signal, from the temperature compensation circuit 110. In various embodiments, the temperature sensing and calibration circuit 108 can be configured to sense the operating temperature. Using the control signal, the compensation signal, and/or the operating temperature, the temperature sensing and calibration circuit 108 can calibrate the XO circuit 106 to compensate for temperature-related frequency shifts and/or to lock a frequency of the output clock signal to the reference clock signal. The output clock signal can be continuously fed back to the PLL circuit 104 and compared to the reference clock signal to correct differences (e.g., phase error, frequency error) between the two signals. This feedback loop can ensure that phase error is minimized. The PLL circuit 104 is referred to as "locked" when the output clock signal is synchronized with the reference clock signal.

Figure 1B:
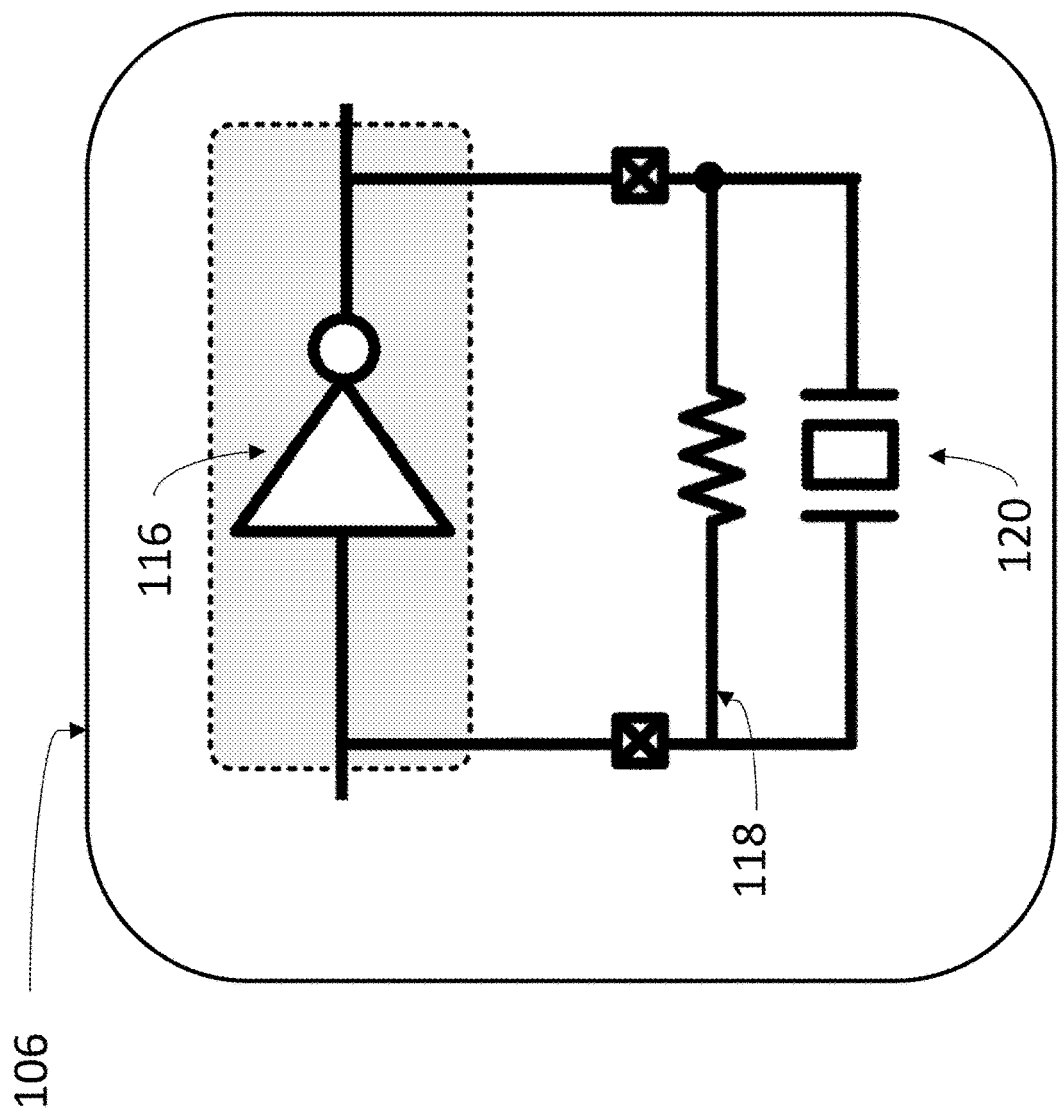
FIG. 1B depicts a portion of the ULP timing circuit system that includes a crystal oscillator circuit, such as the oscillator circuit shown in FIG. 1A.

FIG. 1B depicts a portion of the ULP timing circuit system that includes a crystal oscillator circuit, such as the oscillator circuit shown in FIG. 1A. The XO circuit 106 can include an analog amplifier 116 electrically connected in parallel to a resistor 118 and a crystal (XTAL) 120. The analog amplifier can be biased sub-threshold.

Figure 2A:
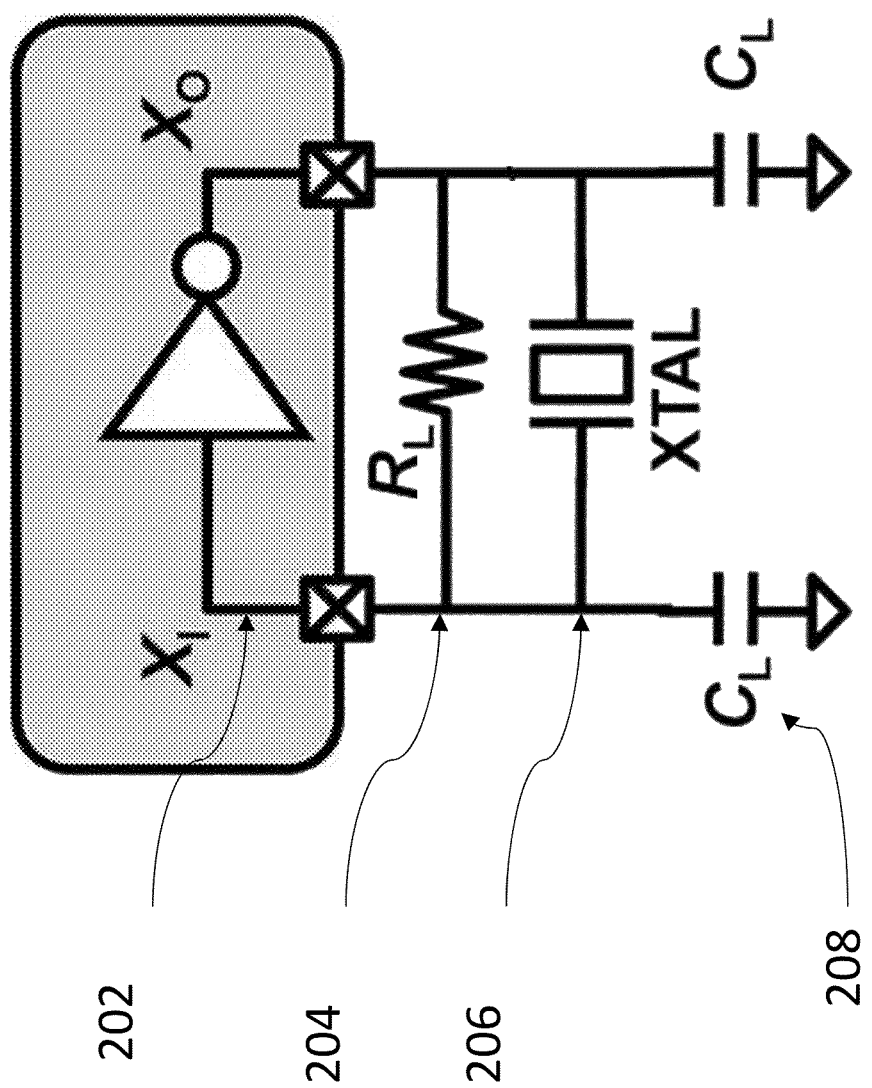
FIGS. 2A and 2B depict a conventional crystal oscillator circuit according to various embodiments of the present disclosure.
Figure 2B:
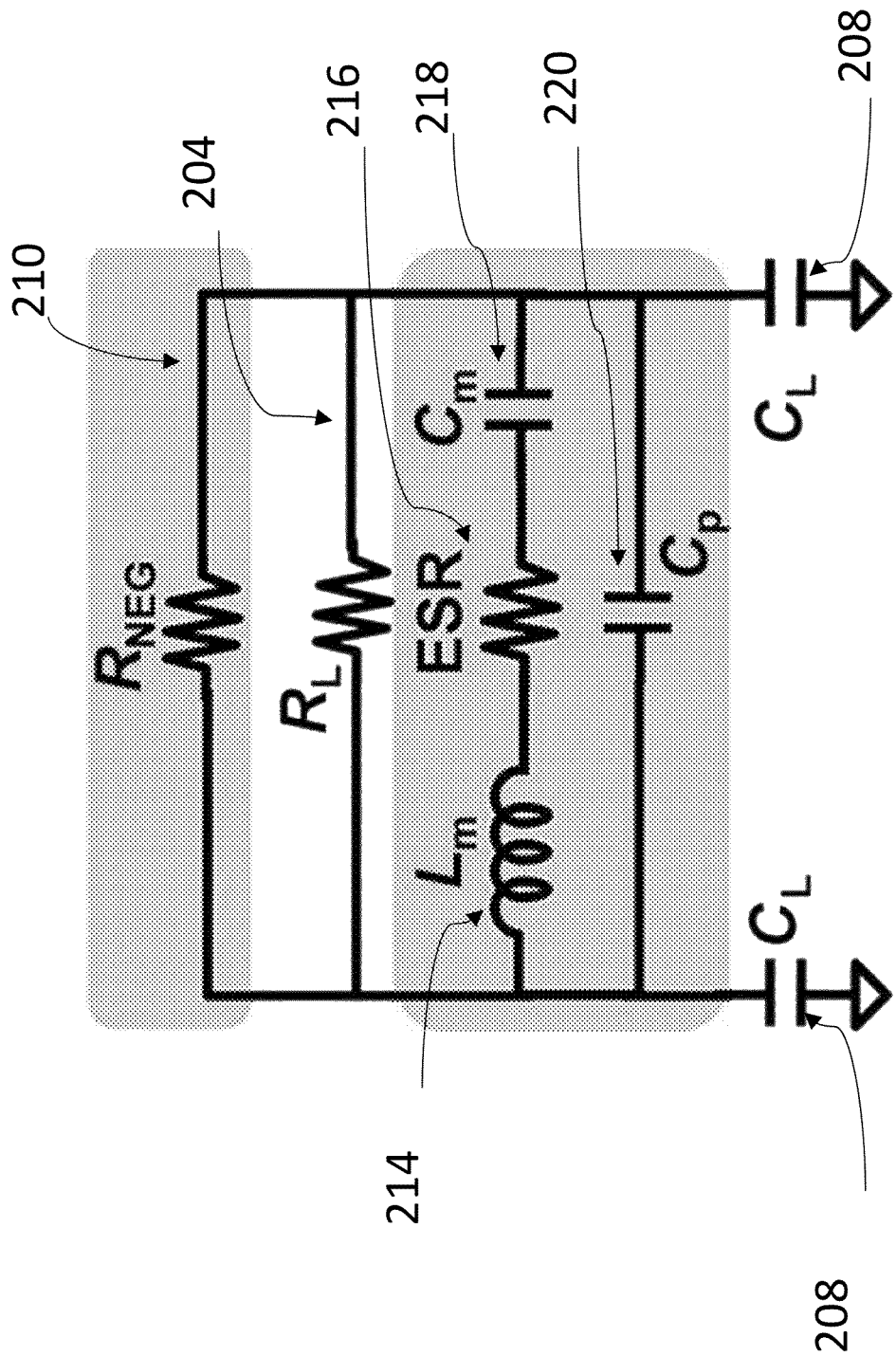

FIG. 2A depicts a conventional crystal oscillator circuit, such as the circuit shown in FIG. 1B. FIG. 2B depicts an equivalent circuit model of the crystal oscillator circuit depicted in FIG. 2A. In various embodiments, an XO circuit can be made to oscillate in series or parallel mode. In parallel mode, such as what is shown in FIGS. 2A and 2B, the XTAL can be electrically connected in parallel with an amplifier (e.g., inverting amplifier) 202, resistor $R_L$ 204, and multiple load capacitors $C_L$ 208. An XTAL is an electromechanical resonator that resonates at its natural frequency when excited with electrical energy. The equivalent circuit model of an XTAL can include a series RLC circuit 214, 216, and 218 (i.e., resistor, inductor, and capacitor) with a parasitic parallel capacitor $C_P$ 220. The frequency of oscillation can be determined by the inductor $L_M$ 214 and capacitor $C_M$ 218. The resistor ESR 216 can model an energy dissipating component of the XTAL. The amplifier (e.g., inverting amplifier) 202 can provide a negative resistance, as modeled by $R_{NEG}$ 210, to overcome the dissipation from ESR 216 and provide energy to the XTAL, making the XTAL oscillate at its natural frequency. The frequency of oscillation of the XTAL can be relatively independent of voltage and process variation. As an alternative to an XO circuit with an XTAL, the analog amplifier of an XO circuit can be electrically connected to an on-chip oscillator, in which the analog amplifier can be biased subthreshold.

The temperature sensing and calibration circuit can include multiple varactors 109 electrically connected to the XO circuit 106, the PLL circuit 104, and the temperature compensation circuit 110, as shown in FIG. 1A. At least two of the varactors 109 can be configured to produce a first XO control signal based on the temperature compensation signal from the temperature compensation circuit 110. At least another two varactors 109 can be configured to produce a second XO control signal based on the control signal from the PLL circuit 104. The XO circuit 106 can be configured to adjust the output clock signal based on the first XO control signal and the second XO control signal.

The temperature compensation circuit 110 can include a bandgap reference circuit, an analog temperature sensor, and a voltage conditioning circuit. The bandgap reference circuit, the analog temperature sensor, and the voltage conditioning circuit can be coupled in series. The compensation signal, provided by the temperature compensation circuit 110, can comprise a thermal voltage. The analog temperature sensor can include a proportional to absolute temperature (PTAT) current source. The PTAT current source can be configured to generate a PTAT current that varies with temperature. The analog temperature sensor can include a switched-capacitor converter that can be configured to generate an analog voltage signal based on current.

Figure 3A:
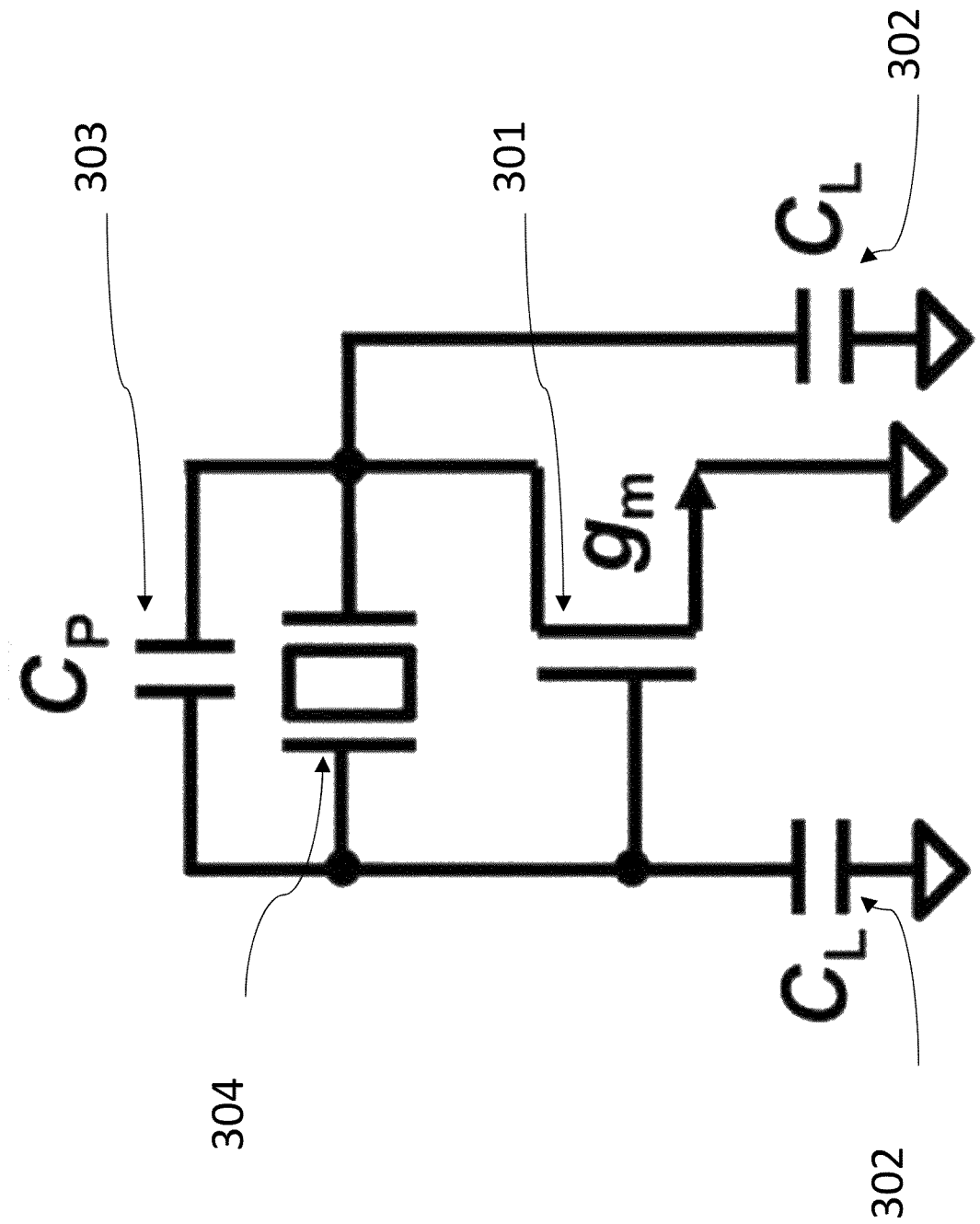
FIG. 3A depicts a three-point oscillator of an ULP timing circuit system according to various embodiments of the present disclosure.

FIG. 3A depicts a three-point oscillator of an ULP timing circuit system with a parasitic capacitor $C_P$ 303 and load capacitors $C_L$ 302 electrically connected in parallel with a XTAL 304. The three-point oscillator can include a transistor 301 having a transconductance of $g_m$. Transconductance can refer to a transistor's ability to convert an input voltage into an output current. In an oscillator circuit, transistors can assist in providing the gain, which is can be used to amplify the signal and provide the negative resistance needed to sustain XTAL oscillations. To sustain oscillations, the XO circuit may compensate for losses due to, for example, the inherent resistance of the circuit. The transistor's gain, which can be influenced by its transconductance, can contribute to the negative resistance that may be used to offset these losses.

Figure 3B:
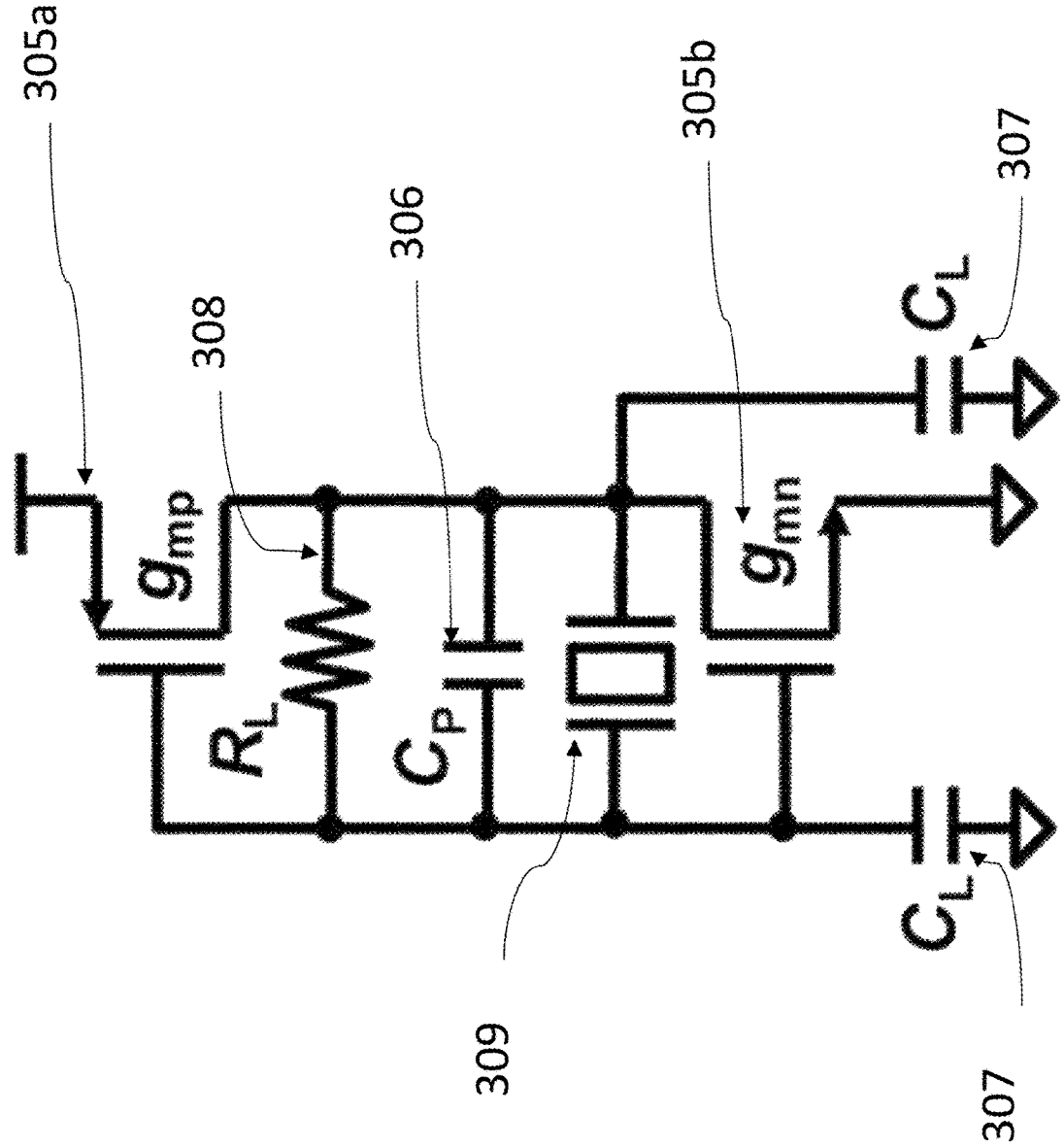
FIG. 3B depicts a practical implementation of the oscillator shown in FIG. 3A with an inverter.

FIG. 3B depicts a practical implementation of the oscillator shown in FIG. 3A with an inverter. A "push-pull" oscillator, such as the one depicted in FIG. 3B, can include a parasitic capacitor $C_P$ 306, load capacitors $C_L$ 307, and resistor $R_L$ 308 all electrically connected in parallel with a XTAL 309. A "push-pull" oscillator can include both pMOS and nMOS transistors, such as transistors 305a and 305b. The pMOS transistors 305a can have a transconductance of $g_{mp}$, while the nMOS transistors 305b can have a transconductance of $g_{mn}$. Multiple transistors in an inverter-based oscillator, such as the one depicted in FIG. 3B, can enhance the power efficiency and performance of the XO circuit. Multiple transistors can be configured to achieve a higher effective transconductance, which can be crucial for amplifying the signal and maintaining stable oscillations.

Figure 4A:
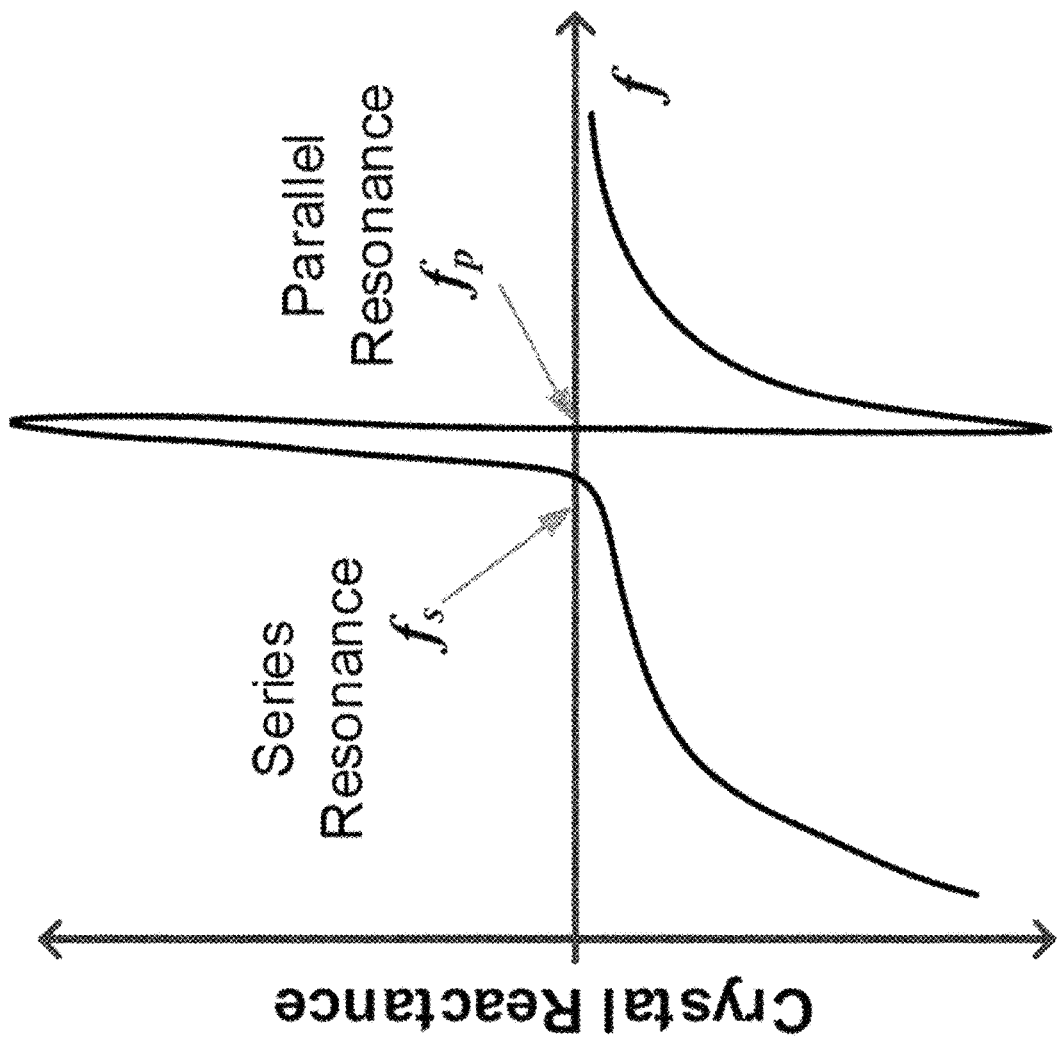
FIGS. 4A and 4B depict illustrative graphs of outputs of a crystal and crystal oscillator of an ULP timing circuit system according to various embodiments of the present disclosure.

FIG. 4A depicts an illustrative graph of crystal reactance of an XTAL in a XO circuit as a function of frequency. The illustrative graph qualitatively identifies resonant frequencies $f_s$ and $f_p$, corresponding to the series and parallel resonance conditions, respectively, for a crystal modeled as a series RLC circuit and as a parallel circuit. Series resonance can occur at frequency $f_s$ when the inductive reactance and capacitive reactance of a series RLC circuit are equal in magnitude but opposite in sign. At this resonant frequency, $f_s$, the crystal reactance may be zero, leading to minimized impedance. Minimizing the impedance can allow the circuit to amplify and sustain the crystal oscillations. Below the $f_s$ frequency, the series RLC circuit can exhibit capacitive reactance and above the $f_s$ frequency, it can exhibit inductive reactance. Parallel resonance can occur at frequency $f_p$, when the inductive reactance and capacitive reactance of the parallel RLC circuit are equal in magnitude but opposite in sign. At this resonant frequency, $f_p$, the impedance can be maximized due to high reactance. The impedance peak can occur because, at $f_p$, the parallel combination of the capacitive reactance and inductive reactance can result in a high impedance.

Figure 4B:
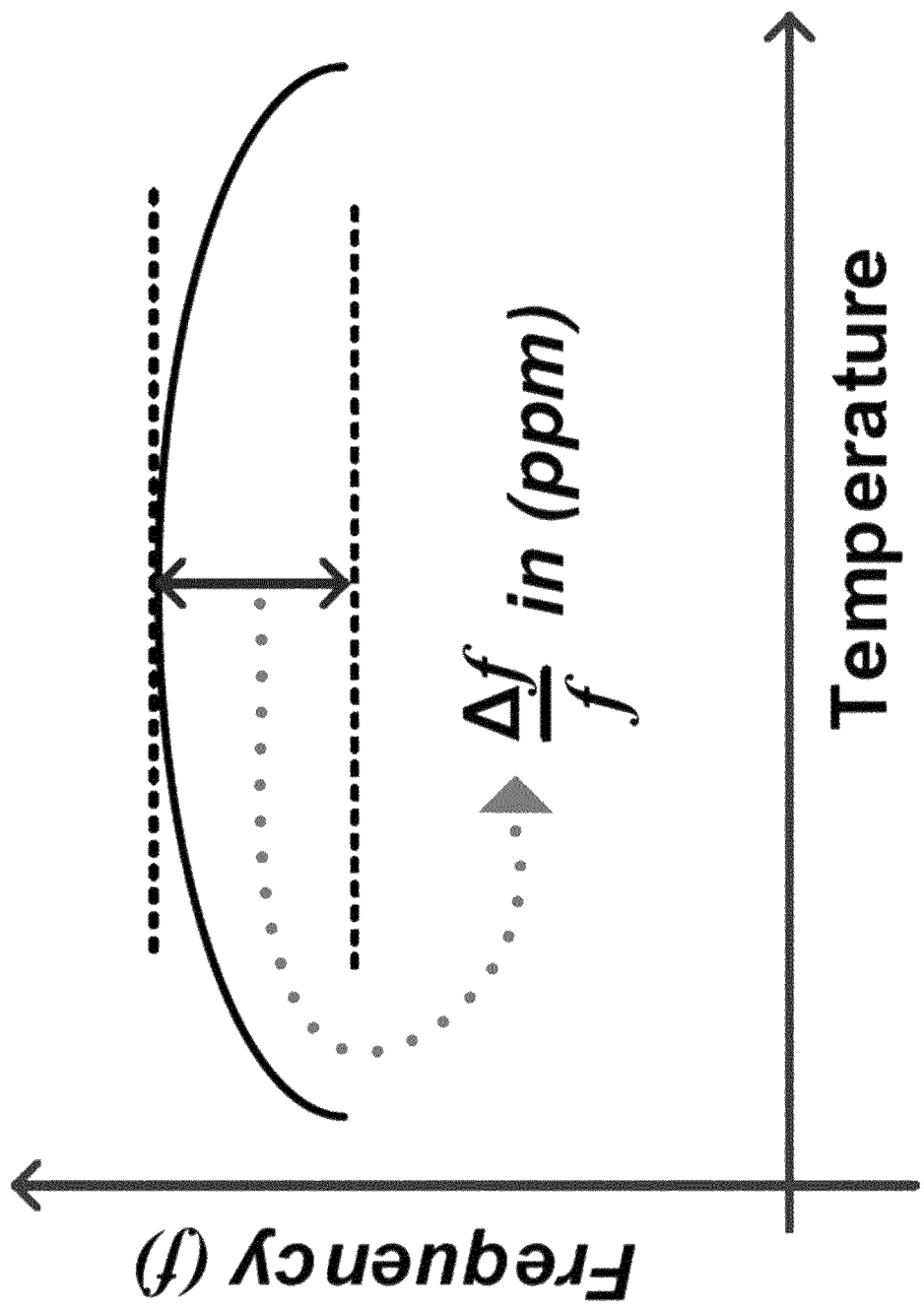

FIG. 4B depicts an illustrative graph of frequency as a function of temperature of a crystal oscillator. The illustrative graph generally shows how the oscillation frequency changes with temperature. The illustrative graph can additionally show the frequency stability of the crystal oscillator with respect to temperature changes.

Figure 5:
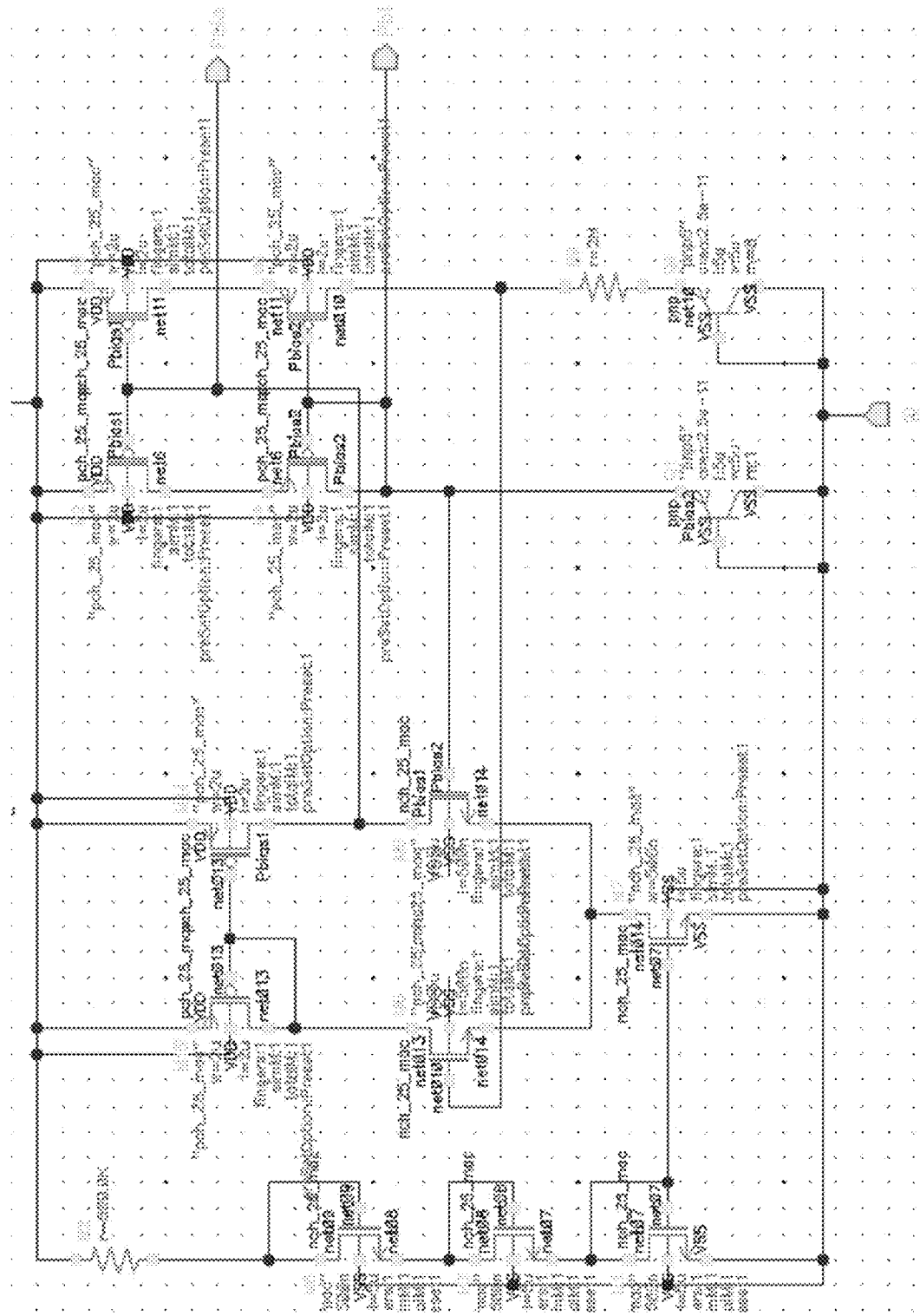
FIG. 5 depicts a circuit layout simulating a proportional-to-absolute-temperature (PTAT) current source with an integrated bias structure according to various embodiments of the present disclosure.

FIG. 5 depicts a circuit layout simulating a proportional-to-absolute-temperature (PTAT) current source with an integrated bias structure.

Figure 6:
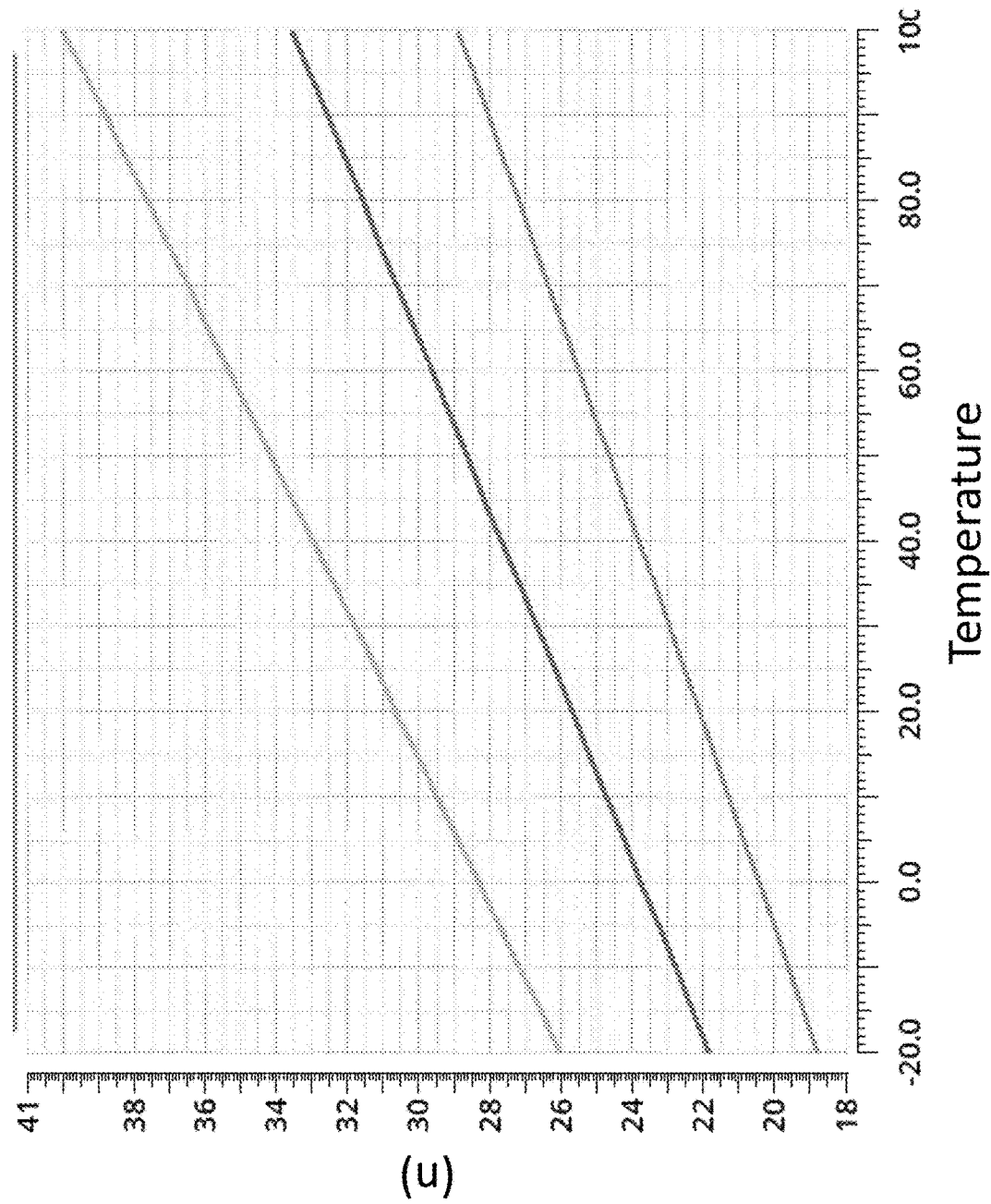
FIG. 6 shows a plot of a PTAT bias currents generated by a PTAT source with an integrated bias structure, such as the one shown in the circuit layout of in FIG. 5, as a function of temperature according to various embodiments of the present disclosure.

FIG. 6 shows a plot of a PTAT bias currents generated by a PTAT source with an integrated bias structure, such as the one shown in the circuit layout of FIG. 5, as a function of temperature. An integrated bias structure in a ULP timing circuit system can offer significant advantages in terms of temperature compensation, accuracy, stability, and power efficiency. By providing a table reference that adjusts with temperature and managing biasing conditions, the precision of a ULP timing circuit system can be improved over a range of environmental conditions.

Figure 7:
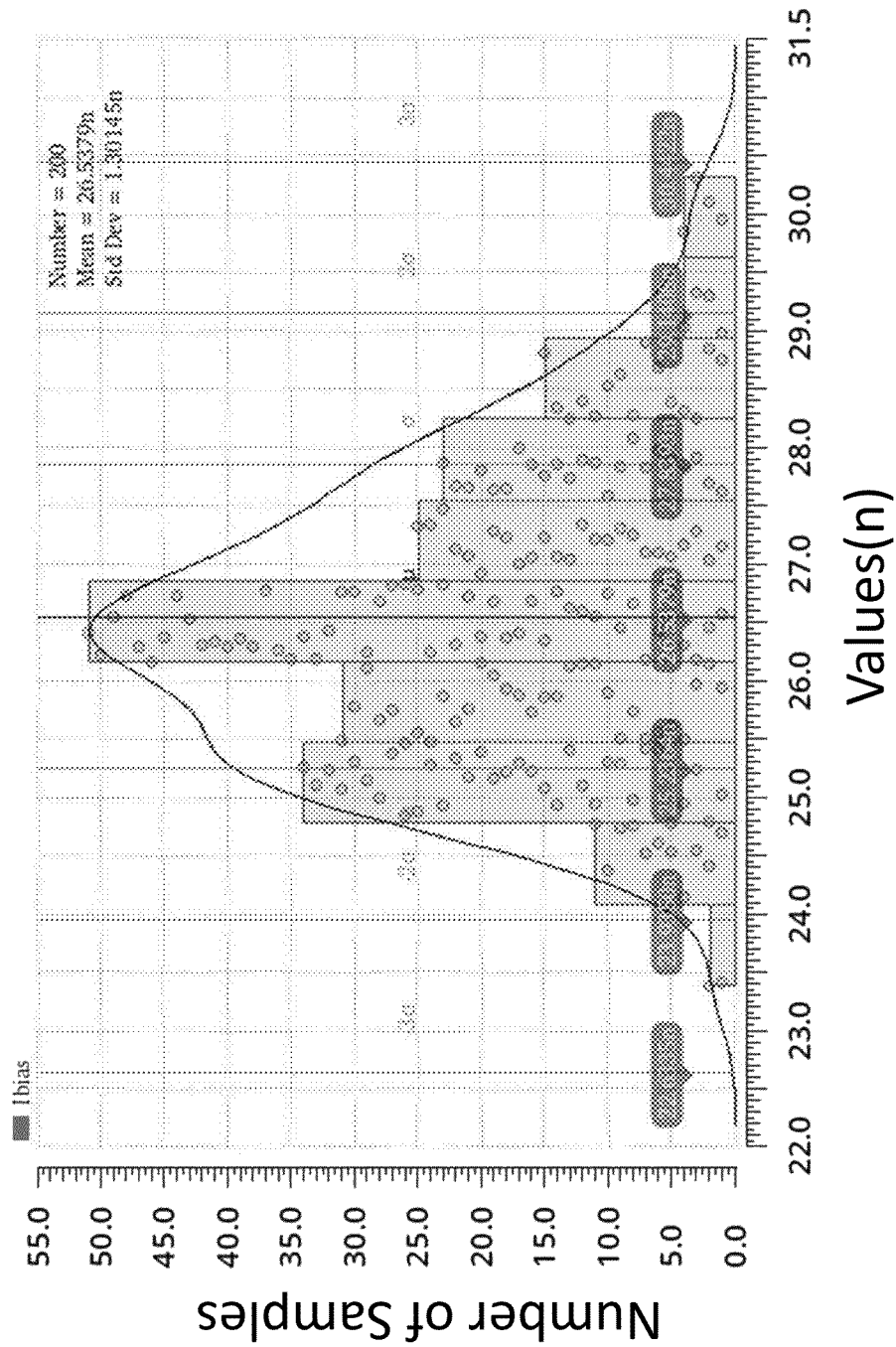
FIG. 7 shows a histogram of the statistical variation of the PTAT bias current generated by a PTAT current source with an integrated bias structure, such as the one shown in FIG. 5, across 200 sample measurements according to various embodiments of the present disclosure.

FIG. 7 shows a histogram of the statistical variation of the PTAT bias current generated by a PTAT current source with an integrated bias structure, such as the one shown in FIG. 5, across 200 sample measurements. As shown in FIG. 7, the average and standard deviation across 200 samples was 26.5379 n and 1.30145 n, respectively. The measurements exhibited a generally normal distribution with low variance, as indicated by the small standard deviation.

Figure 8:
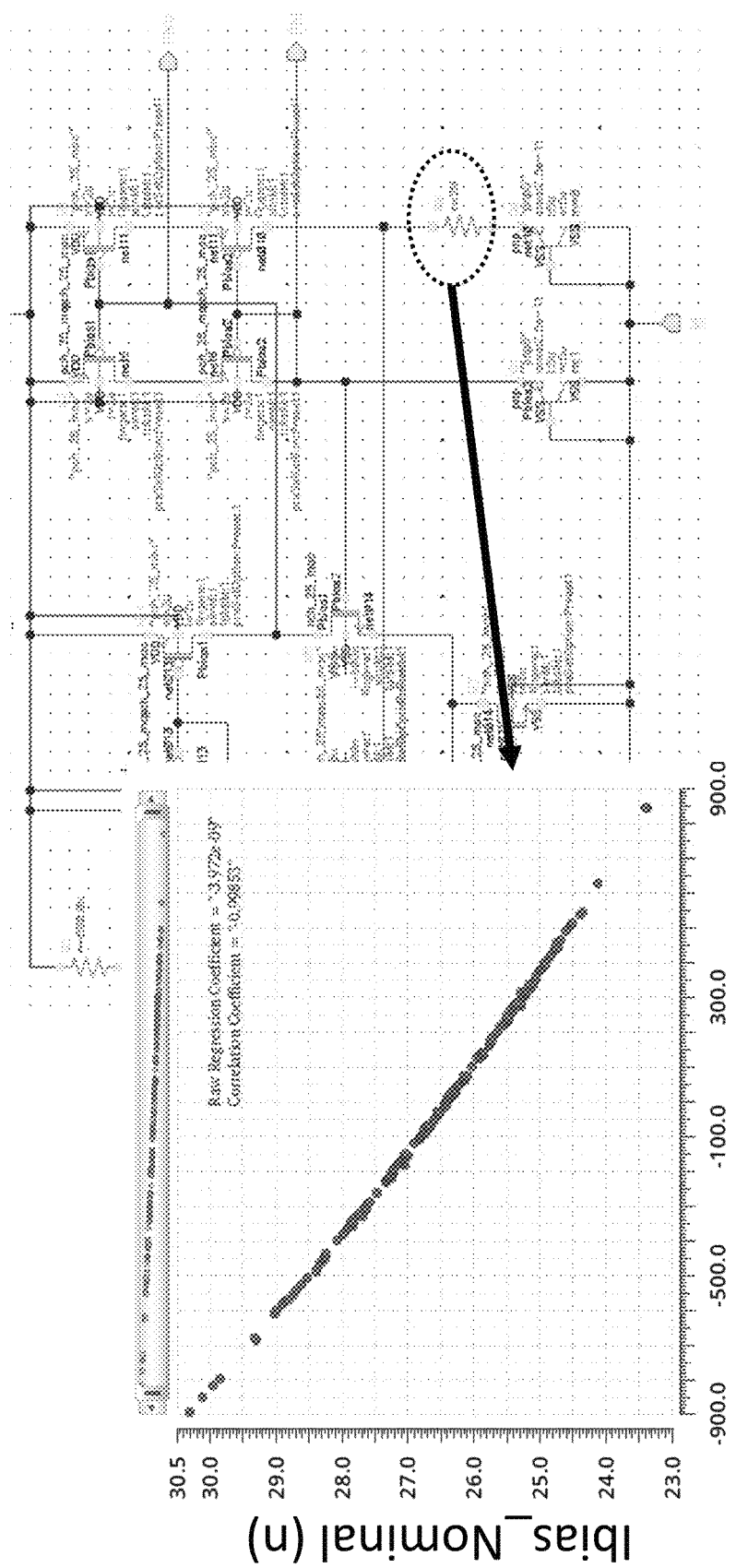
FIG. 8 shows a plot of the nominal PTAT bias current generated as a function of the resistance value of a resistor within a circuit layout depicted in FIG. 5 according to various embodiments of the present disclosure.

FIG. 8 shows a plot of the nominal PTAT bias current generated as a function of the resistance value of a resistor within a circuit layout depicted in FIG. 5. The plot shows a decreasing nominal bias current with increasing resistance in which the resistance increases from a negative resistance value to a positive resistance value.

Figure 9:
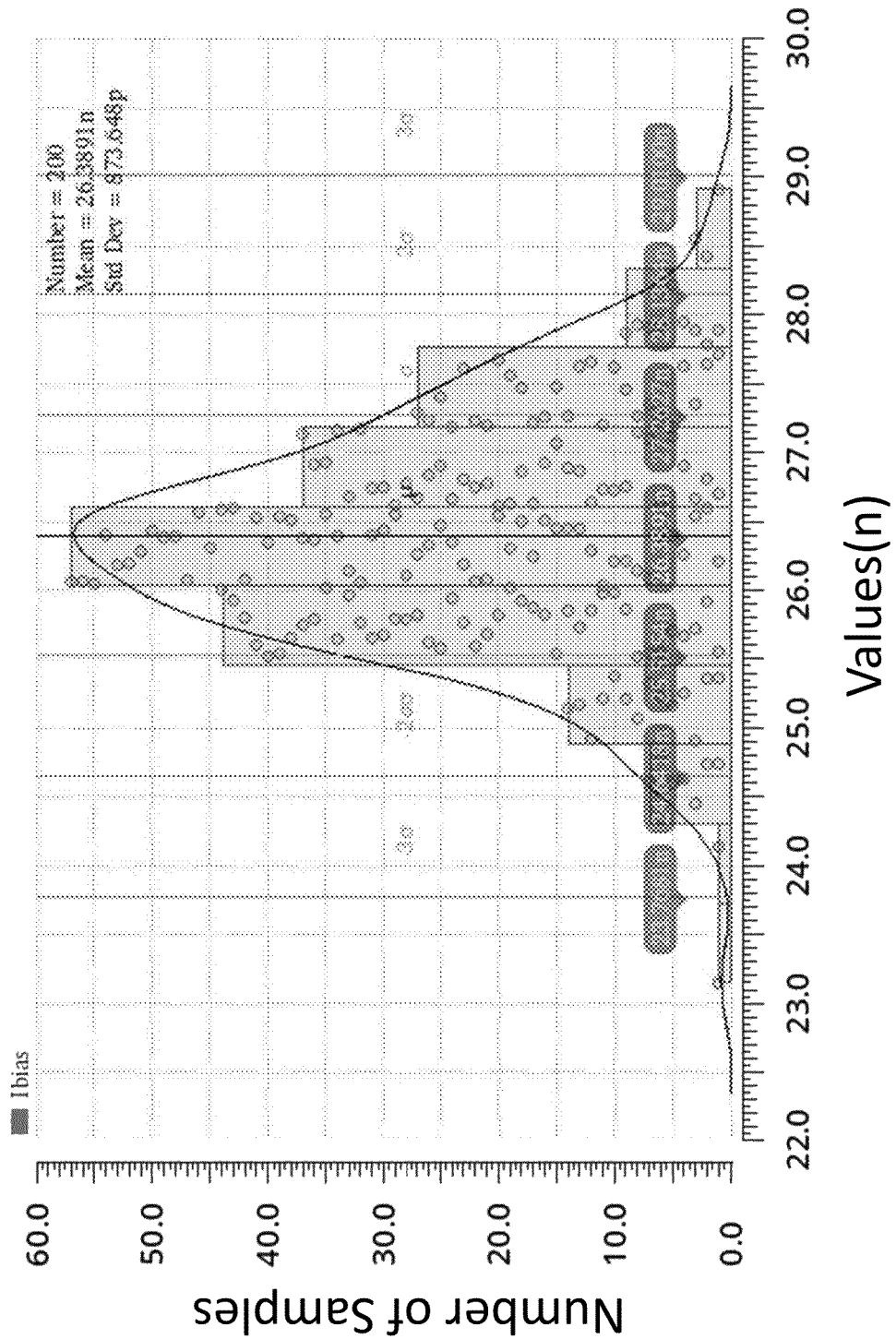
FIG. 9 shows a histogram related to device-mismatch variation of the PTAT bias current generated by a PTAT source with an integrated bias structure, such as the one shown in FIG. 5, across 200 sample measurements according to various embodiments of the present disclosure.

FIG. 9 shows a histogram related to device-mismatch variation of the PTAT bias current generated by a PTAT current source with an integrated bias structure, such as the one shown in FIG. 5, across 200 sample measurements. As shown in FIG. 9, the average and standard deviation across 200 samples was 26.3891 n and 873.648 p, respectively. The measurements exhibited a generally normal distribution with low variance, as indicated by the small standard deviation.

Figure 10A:
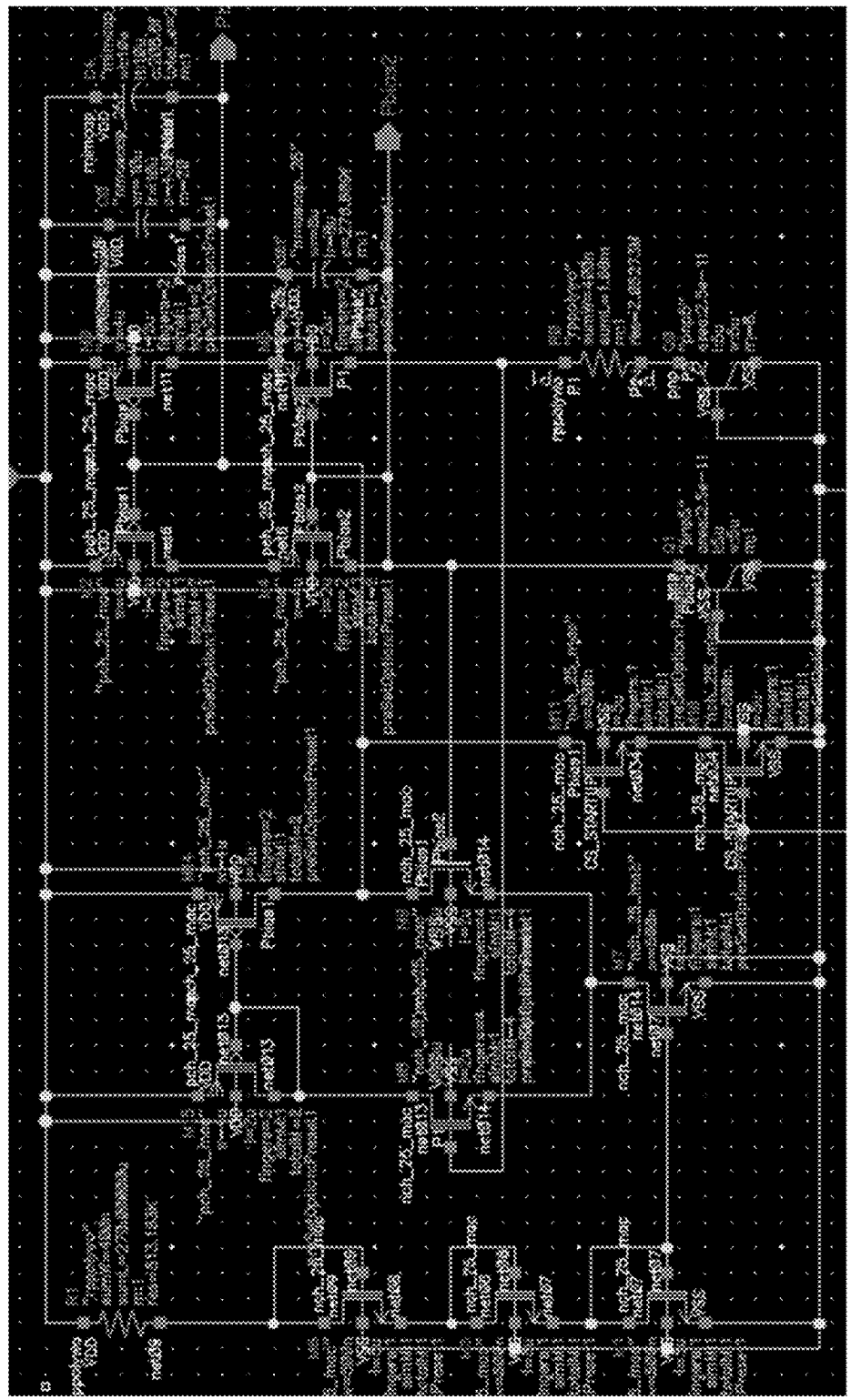
FIG. 10A depicts a circuit layout simulating a proportional-to-absolute-temperature (PTAT) current source with an integrated bias structure according to various embodiments of the present disclosure.

FIG. 10A depicts a circuit layout simulating a proportional-to-absolute-temperature (PTAT) current source with an integrated bias structure. FIG. 10B shows a table summarizing bias current performance across various electronic components shown in FIG. 10A. The bias current performance is expressed as a percentage, representing the measured or expected bias current relative to the nominal bias current. The table shows that the measured currents closely match the expected nominal current, indicating that the robust against device mismatch and variation.

Figure 11:
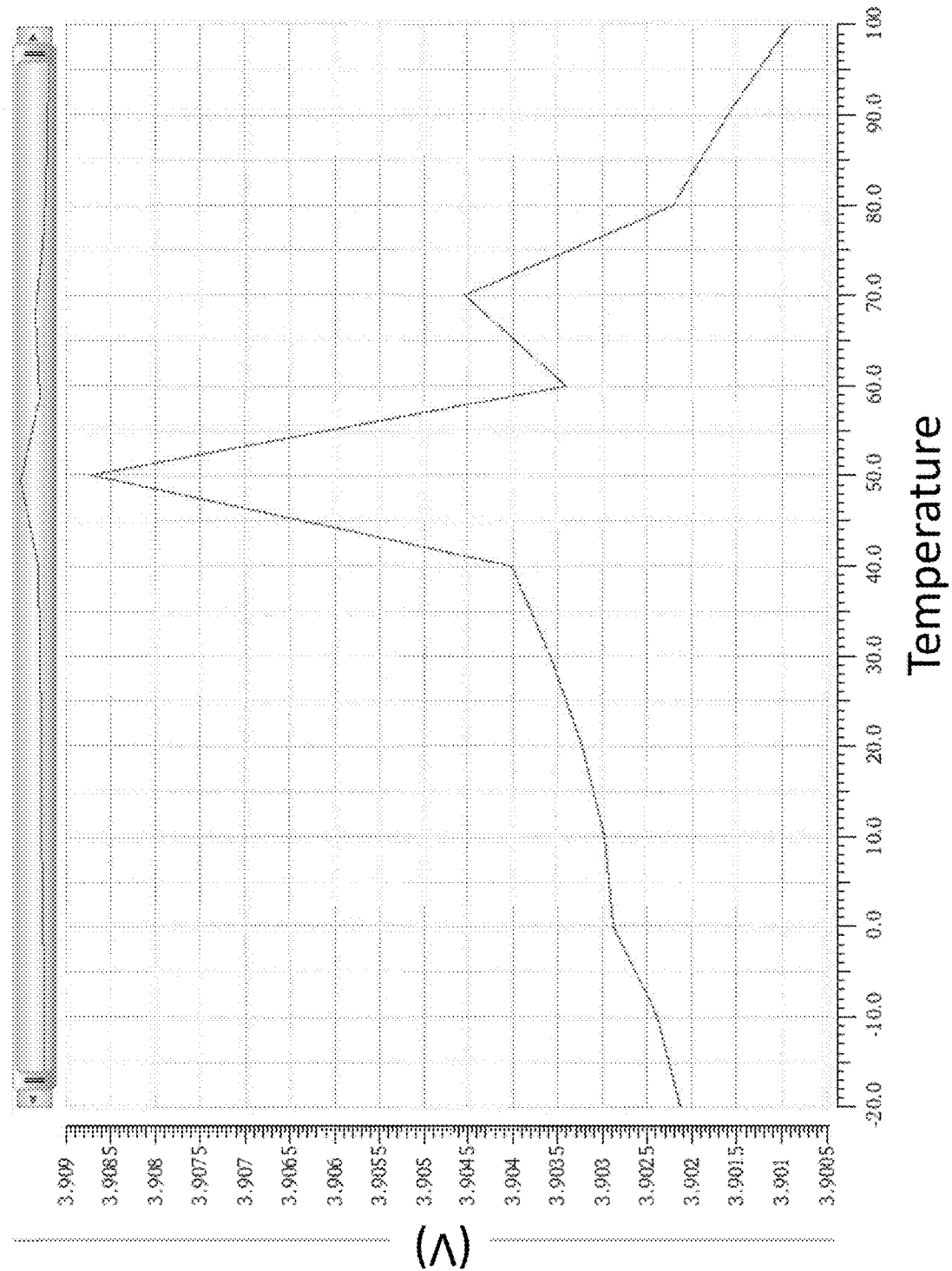
FIG. 11 shows a plot of the voltage as a function of temperature related to transconductance-stage evaluation of a crystal oscillator circuit according to various embodiments of the present disclosure.

FIG. 11 shows a plot of the voltage as a function of temperature related to transconductance-stage evaluation of a crystal oscillator circuit. The graph shows that voltage variation was relatively small with increasing temperature across the transconductance stage. Specifically, the voltage varied between 3.9005 V and 3.909 V over a temperature range of −20 to 100° C. This implied that transconductance value, $g_m$, remained constant and stable with temperature changes. This stability may be useful because the PTAT bias current can compensate for temperature changes in a linear manner. Hence, the results further demonstrate the effective design of the crystal oscillator circuit in maintaining stable transconductance across a wide temperature range.

Figure 12:
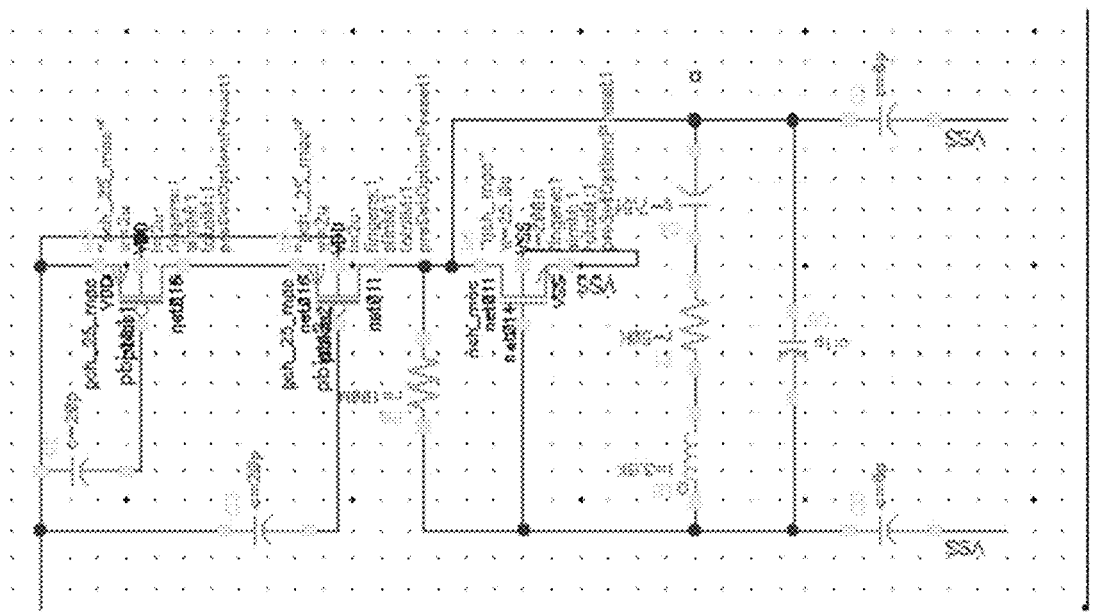
FIG. 12 depicts a circuit layout of a crystal oscillator with an amplifier electrically coupled to an XTAL equivalent circuit according to various embodiments of the present disclosure.

FIG. 12 depicts a circuit layout of a crystal oscillator with an amplifier electrically coupled to an XTAL equivalent circuit model.

Figure 13:
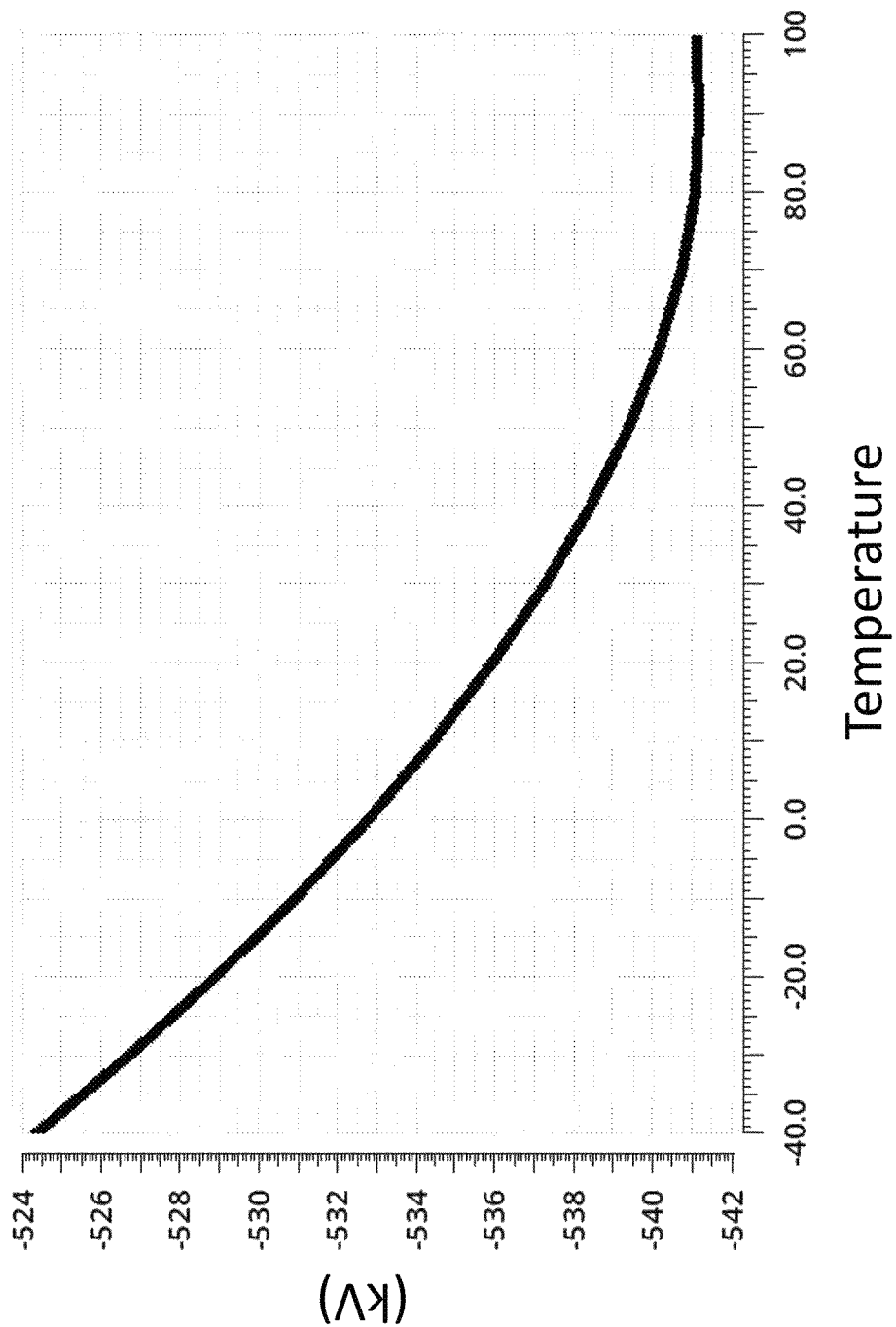
FIG. 13 shows a plot of the negative resistance ($R_{NEG}$) versus temperature variation according to various embodiments of the present disclosure.

FIG. 13 shows a plot of the negative resistance ($R_{NEG}$) supplied by an amplifier of a crystal oscillator versus temperature variation. The plot shows that $R_{NEG}$ decreases with increasing temperature. The drift in $R_{NEG}$ may be due to the characteristics of the resistor that is used in the equivalent circuit model of the amplifier. A frequency stability of 230 ppm/° C. may be achieved by the crystal oscillator. This can be decreased to a range between 20 and 30 ppm/° C. by using a switched-capacitor design of the crystal oscillator.

Figure 14:
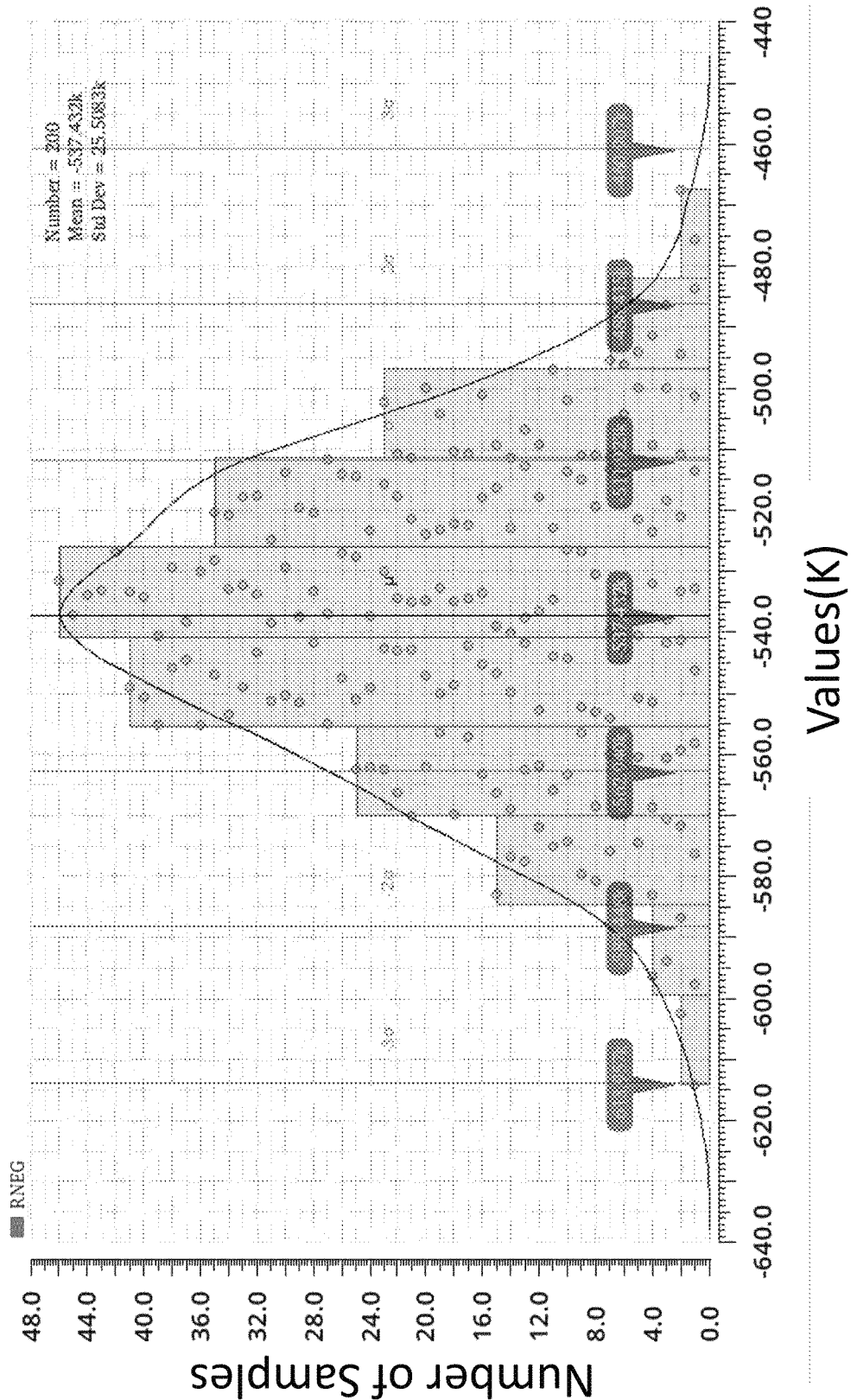
FIG. 14 shows a histogram of the process variation of the negative resistance ($R_{NEG}$) supplied by an amplifier of a crystal oscillator according to various embodiments of the present disclosure.

FIG. 14 shows a histogram of the process variation of the negative resistance ($R_{NEG}$) supplied by an amplifier of a crystal oscillator. As shown in FIG. 14, the average and standard deviation across 200 samples was −537.432 k and 25.5083 k, respectively. The measurements exhibited a generally normal distribution with low variance, as indicated by the small standard deviation.

Figure 15:
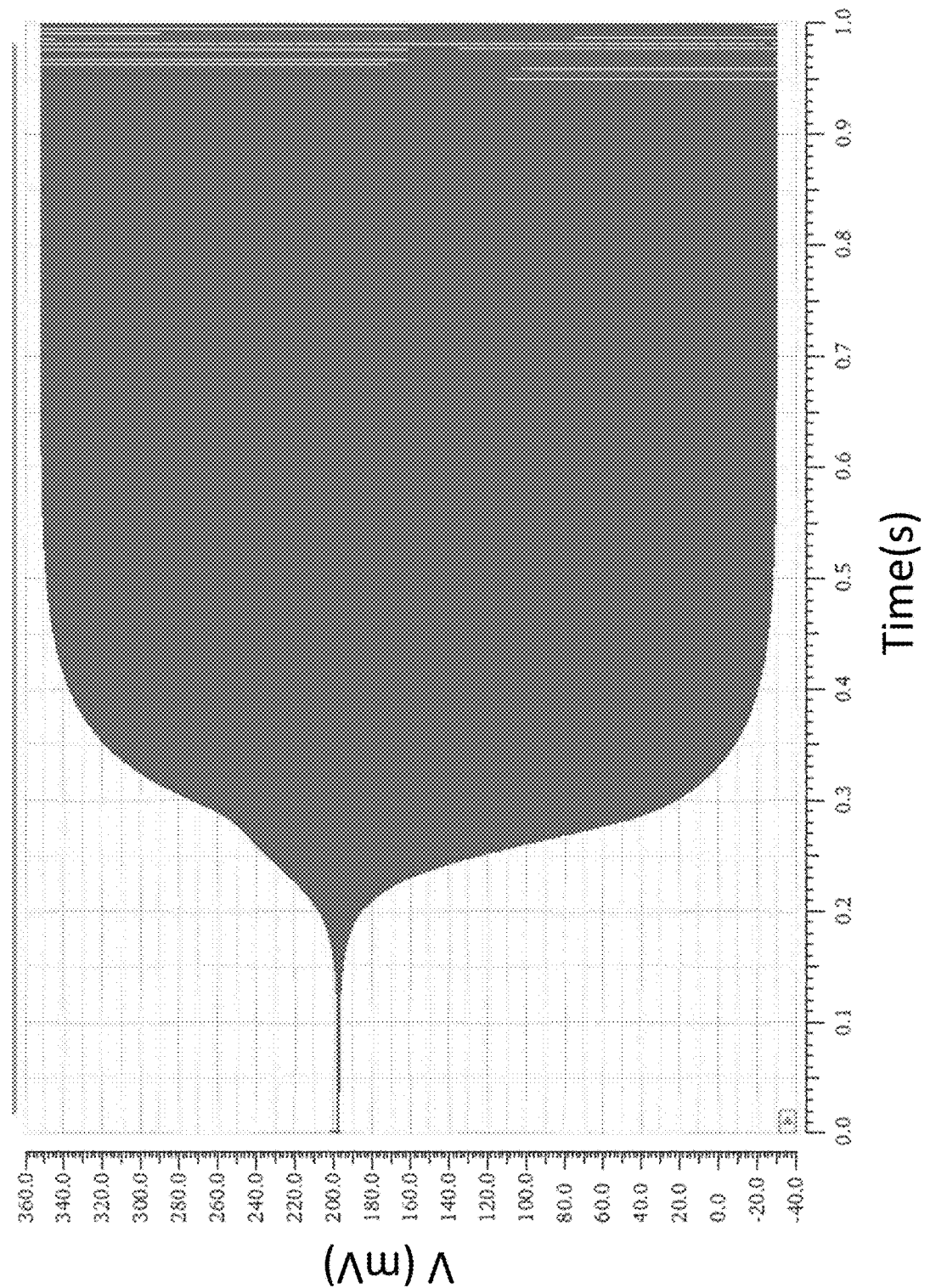
FIG. 15 shows a simulation result of the measured output voltage as a function of simulation time of simulated a crystal oscillator according to various embodiments of the present disclosure.
Figure 17:
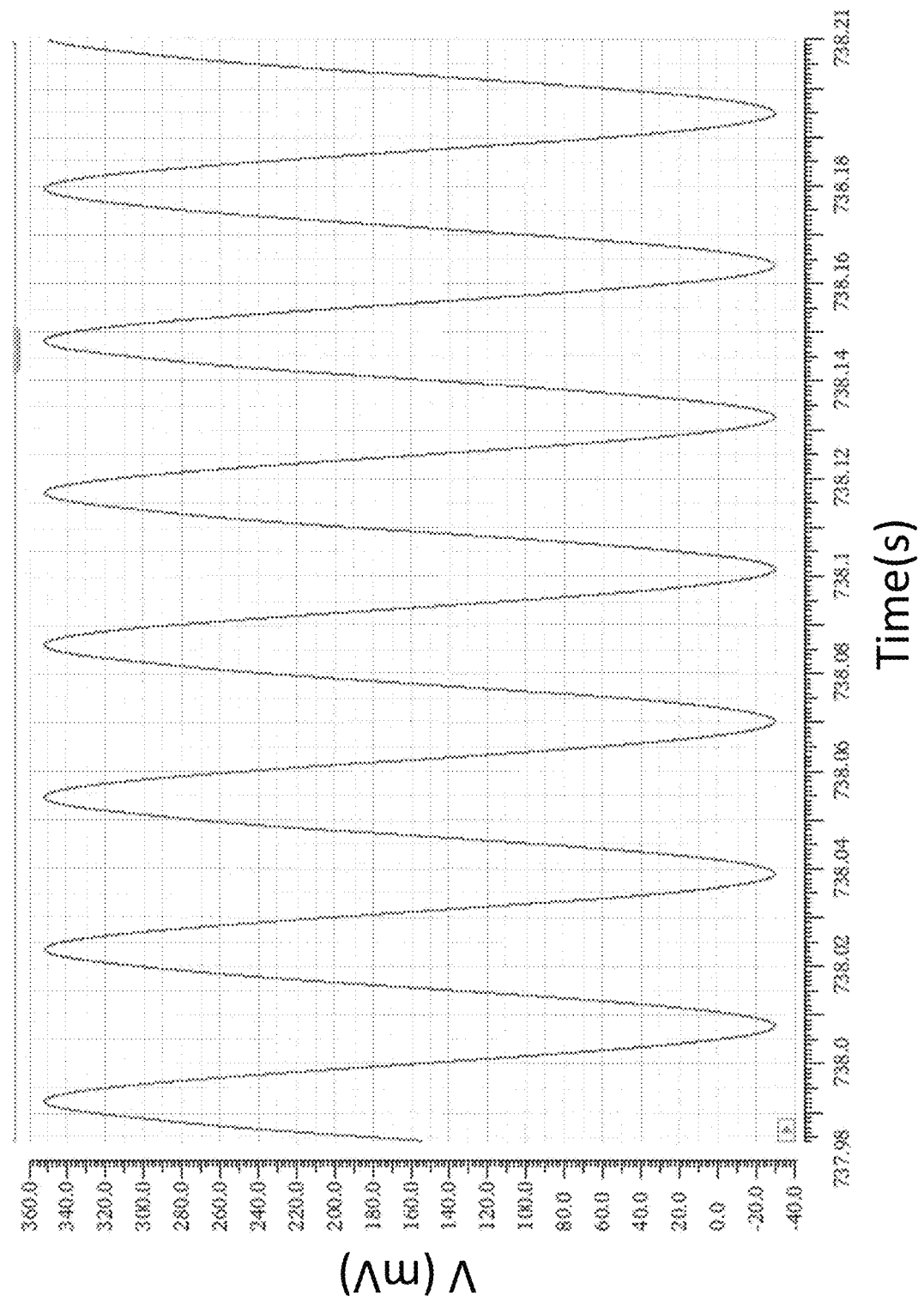
FIG. 17 shows a magnified view of the simulation result shown in FIG. 15 demonstrating a more detailed view of the waveform behavior of the output voltage of a crystal oscillator according to various embodiments of the present disclosure.

FIG. 15 shows a simulation result of the measured output voltage as a function of simulation time of simulated a crystal oscillator. FIG. 17 shows a magnified view of the simulation result shown in FIG. 15 demonstrating a more detailed view of the waveform behavior of the output voltage of a crystal oscillator. The plots show that the output voltage oscillated with simulation time.

Figure 16:
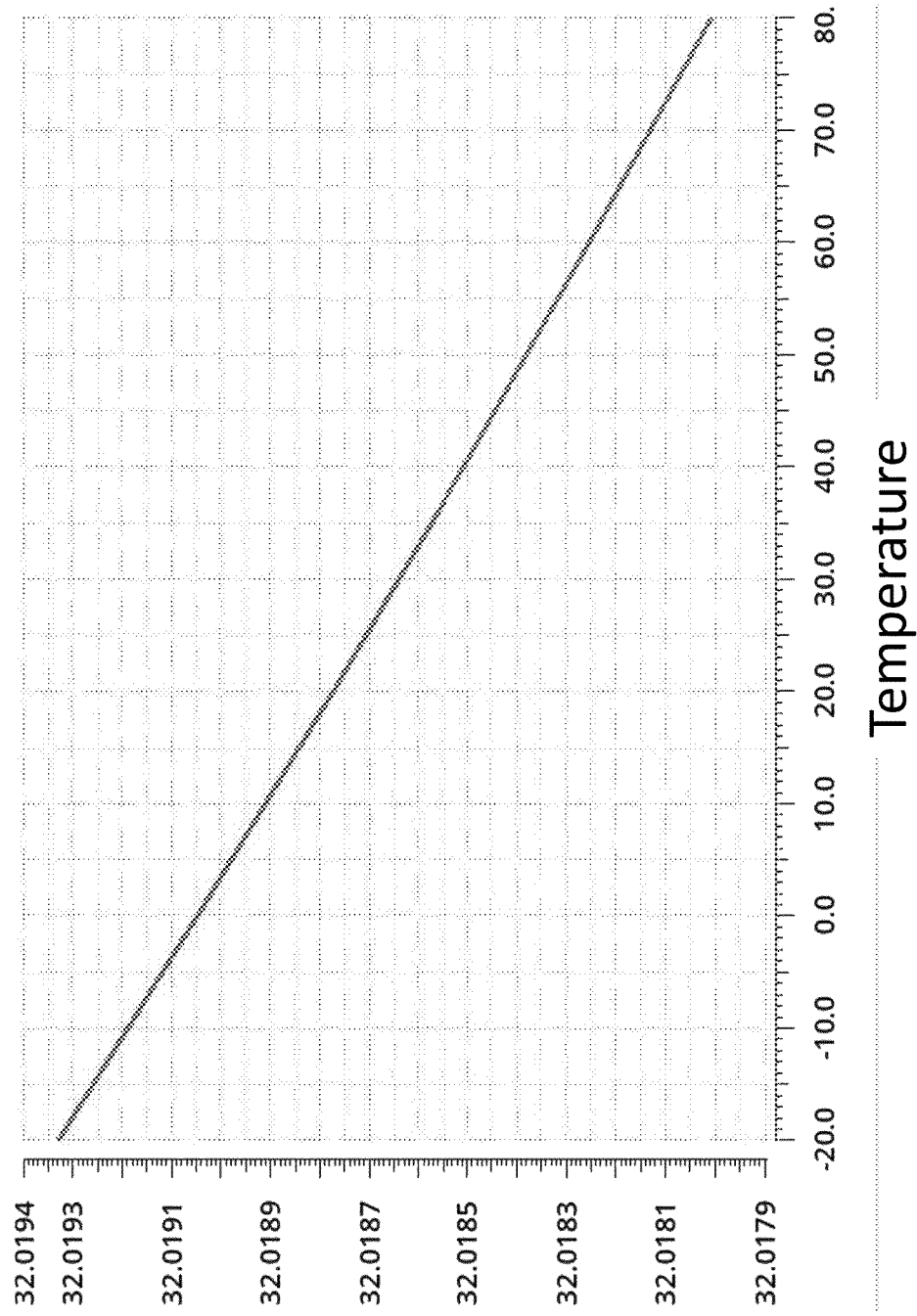
FIG. 16 shows a plot of the frequency variation as a function of temperature for a 32 kHz crystal oscillator according to various embodiments of the present disclosure.

FIG. 16 shows a plot of the frequency variation as a function of temperature for a 32 kHz crystal oscillator. The plot shows that frequency varied linearly with temperature. The frequency decreased from approximately 32.0193 and 32.0180 over a temperature range of −20 and 80° C. This indicated that that the crystal oscillator exhibited a relatively small frequency drift across the specified temperature range, demonstrating robust stability across a wide range of temperatures. A frequency stability of 1.5 ppm/° C. was achieved.

Figure 18A:
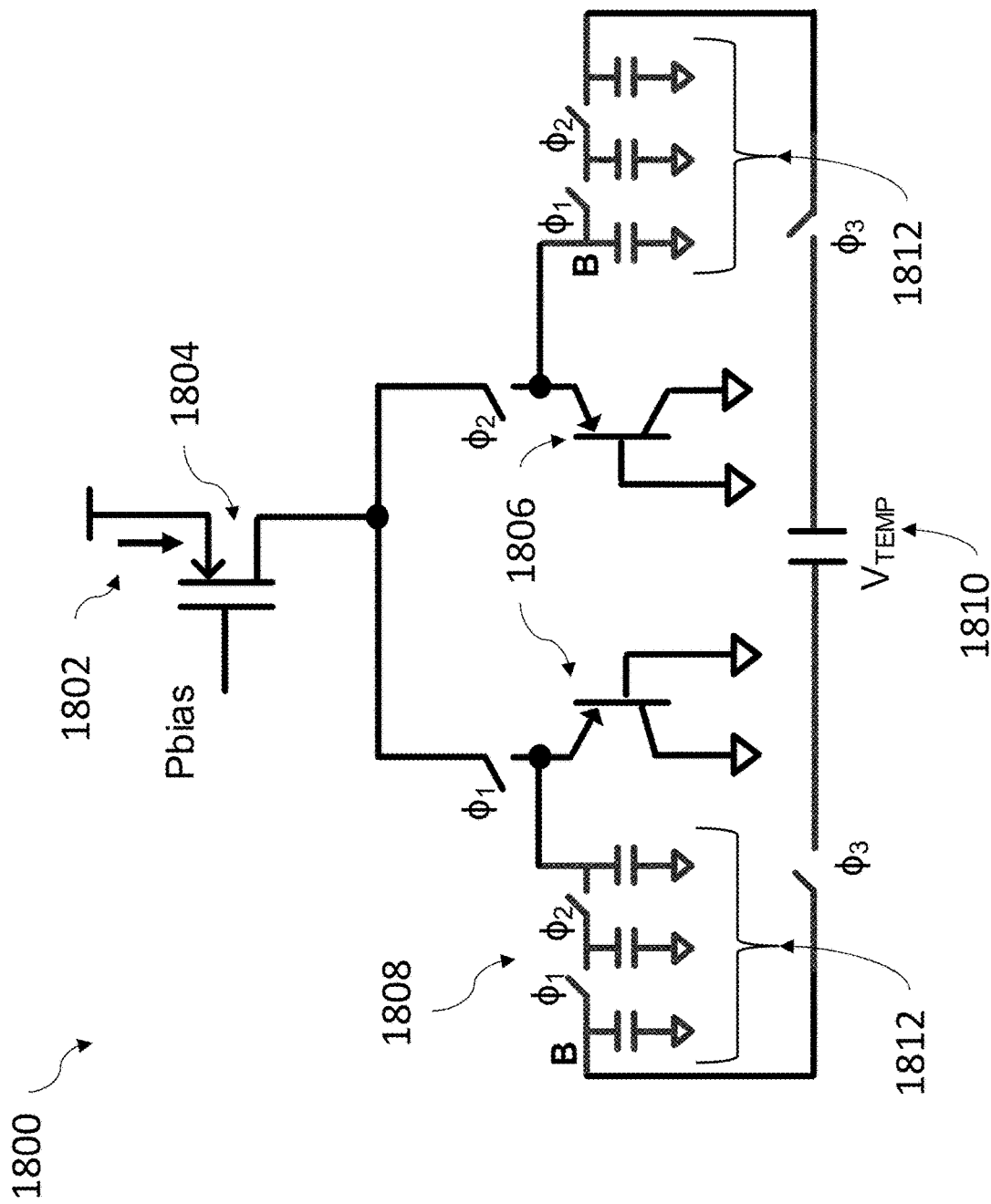
FIGS. 18A and 18B depict a first portion of an ULP temperature sensing system included in a ULP timing circuit system according to various embodiments of the present disclosure.
Figure 18B:
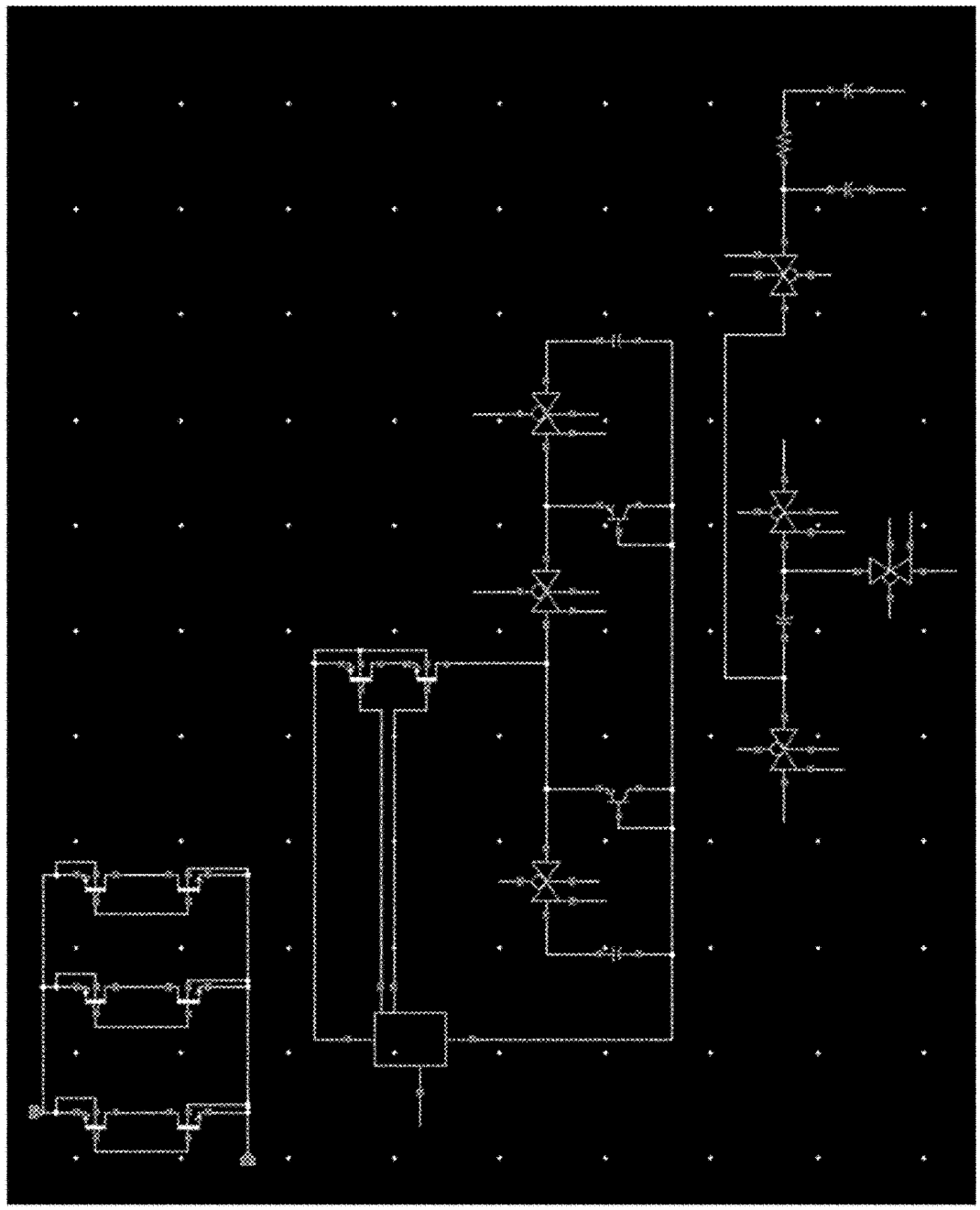

FIGS. 18A and 18B depict a first portion 1800 of an ultra-low power (ULP) temperature sensing system. In particular, in accordance with various embodiments, FIGS. 18A and 18B illustrate the architecture of a portion of a temperature sensing analog circuit that uses a proportional to absolute temperature (PTAT) current source to generate a PTAT current 1802, which may be used to generate an analog voltage signal, $V_{TEMP}$ 1810. The analog voltage signal may be proportional to an operating temperature of the circuitry in which the ULP temperature sensing system is deployed.

A PTAT current is a type of electrical current whose magnitude increases proportionally with absolute temperature. Achieving a PTAT current involves using specific circuit designs that can take advantage of the temperature-dependent characteristics of semiconductor devices. A PTAT current may be generated in several ways. The difference in base-emitter voltages of transistors with different current densities may be used to generate a PTAT current. As shown in FIG. 18A, a PTAT current source may be configured to generate a PTAT current 1802 that varies with a temperature.

The PTAT current source may comprise one or more metal-oxide-semiconductor field-effect transistor (MOSFET) transistor 1804 electrically connected in series with Bipolar Junction Transistors (BJTs) 1806, as shown.

As temperature changes, the gate threshold voltage of the MOSFET transistor, which may be defined as the minimum voltage required to turn on the MOSFET transistor, may also change. This variation in threshold voltage may affect the current flowing through the MOSFET transistor, as the channel conductivity of the MOSFET is influenced by the temperature-induced changes in threshold voltage. This effect can be exploited to generate, such as by a PTAT current source, a current that is proportional to absolute temperature. The MOSFET transistor 1804 may be an n-type metal-oxide-semiconductor (NMOS) transistor, which may use n-type (negatively doped) semiconductors as a source and a drain. Such n-type material may have a higher electron density compared to a p-type material used in p-type metal-oxide-semiconductor transistors.

The MOSFET 1804 may be electrically connected in series to multiple Bipolar Junction Transistors (BJTs) 1806 within the PTAT current source, as shown. The BJTs 1806 may include a plurality of PNP transistors, which include two p-type layers separated by an n-type layer. A relatively small current applied to the base terminal of each BJT may control a relatively larger current flowing between the collector and emitter terminals, which may enable the BJT to amplify or switch electronic signals. In various embodiments, the temperature dependence of the base-emitter voltage and the voltage difference between the base and emitter terminals may be used to generate a PTAT current by the PTAT current source.

The PTAT current source may be biased in the subthreshold region to generate a PTAT current proportional to a temperature. The PTAT current source may have a constant transconductance over a range of conditions (e.g., a wide temperature range).

A switched-capacitor converter 1808 may be electrically coupled to the PTAT current source. The switched-capacitor converter 1808 may be configured to generate an analog voltage signal 1810 based on the PTAT current. The switched-capacitor converter 1808 may include at least one switched-capacitor based resistance which may include a plurality of switched-capacitors 1812. The multiple switched capacitors 1812 may be connected to each other, as shown, and electrically coupled to the PTAT current source. A switched capacitor may be an electronic circuit that performs functions by alternately transferring charges into and out of capacitors as electronic switches are toggled on and off. The switches used in switched-capacitor circuits may use MOSFETs or other types of transistors that are controlled by a switching frequency. The switching frequency of each the switched capacitors 1812 may be a clock frequency of a XO. The analog voltage signal 1810 may be generated by the PTAT current flowing through the switched-capacitor converter 1808, which may equivalently operate as a switched-capacitor based resistance.

Figure 19:
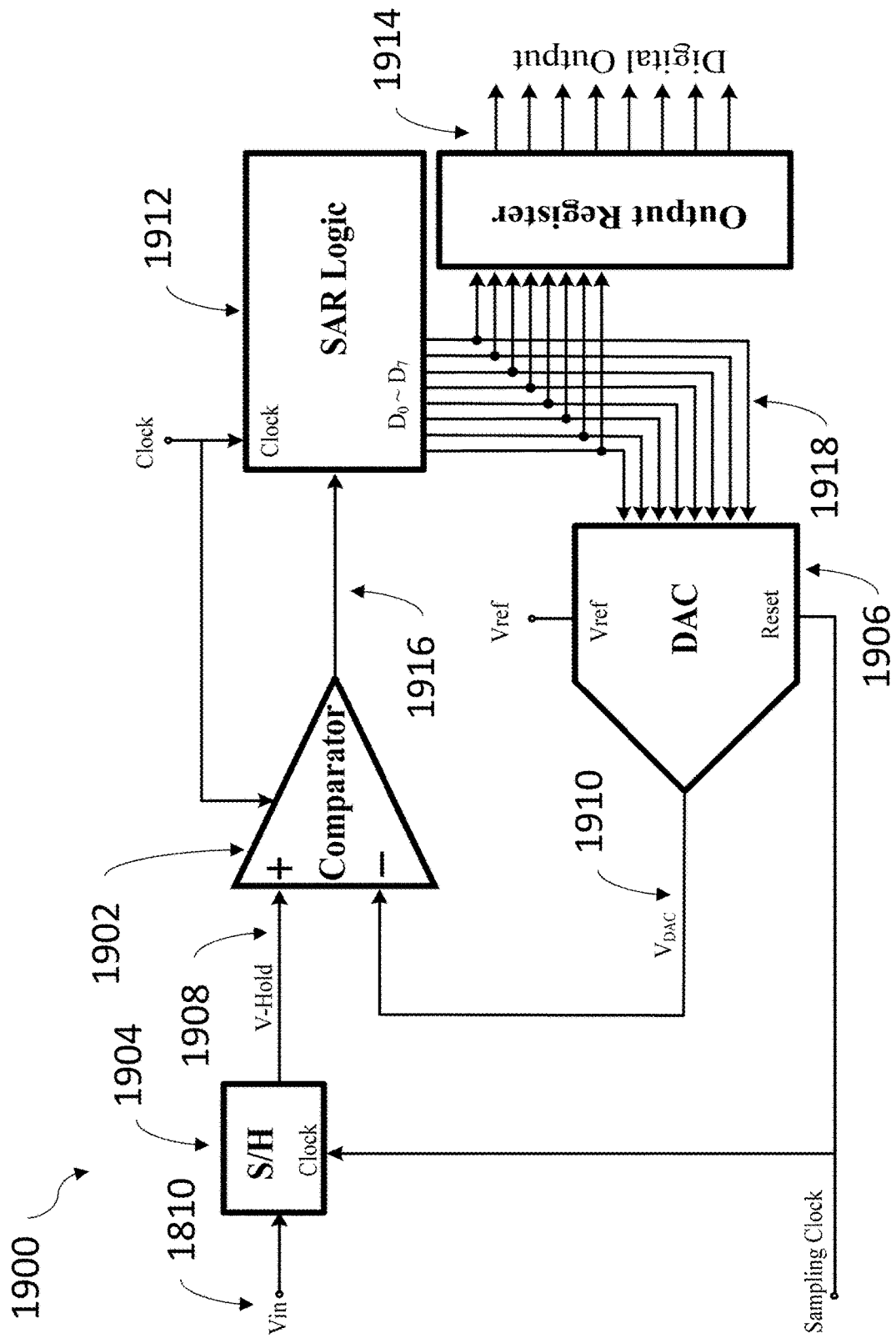
FIG. 19 depicts a block diagram of a second portion of a ULP temperature sensing system that includes an ULP 8-bit SAR Analog-to-Digital Converter (ADC) for converting an analog voltage signal, such as one generated from the analog circuit shown in FIGS. 1A and 1B, to a digital voltage value according to various embodiments of the present disclosure.

FIG. 19 depicts a block diagram of a second portion 1900 of an ULP temperature sensing system that includes ULP 8-bit SAR Analog-to-Digital Converter (ADC) for converting an analog signal, such as analog voltage signal 1810 generated from the analog circuit shown in FIGS. 18A and 18B, to a digital voltage value. The ULP ADC, shown as a part of portion 1900, may be electrically coupled to the PTAT current source and the switched-capacitor converter 1808, described above with reference to FIGS. 18A and 18B. The ULP ADC may be configured to output a digital voltage value corresponding to the analog voltage signal at its input, such as analog voltage signal 1810. The ULP ADC may be a Successive Approximation Register (SAR) ULP ADC. A SAR ULP ADC is a type of ADC that uses a binary search technique to convert an analog signal into a digital representation. As shown in FIG. 19, the ULP ADC may include a comparator 1902, sample and hold circuit 1904, and DAC 1906. The sample and hold circuit 1904 may be clocked by an input clock as shown, and it may be configured to receive an analog voltage signal, such as the analog voltage signal 1810, as an input voltage. The sample and hold circuit output 1908 and DAC output 1910 may be electrically connected to the inputs of comparator 1902. The ULP ADC may further include SAR logic 1912, which may be clocked by an input clock as shown, and may be configured to output a digital voltage value to an output register 1914, which may store the output digital voltage value. The SAR logic 1912 may be coupled to a comparator output 1916 and to DAC inputs 1918. The comparator 1902 may be clocked by an input clock as shown, and may compare the ADC input voltage, such as analog voltage signal 1810, to the output of DAC 1906 and outputs the result to the SAR logic 1912. This output of comparator 1902 may indicate whether there is a difference between the values input to comparator 1902, such as by indicating a logical high value if there is a difference between the input values and a logical low value if there is no difference between the input values. The SAR logic 1912 may output an approximate binary code value corresponding to the voltage input to the DAC. The SAR logic 1912 may receive an indication that its binary code may have to change when the output of comparator 1902 indicates that there is a difference in the input voltages to the comparator. The SAR ULP ADC may perform an iterative conversion of its input voltage, such as analog voltage signal 1810, by successively approximating its input voltage to determine a digital 8-bit binary value representation of its input voltage. For example, it may start with the Most Significant Bit (MSB) and work through the bits to the Last Significant Bit (LSB), using a comparator, such as comparator 1902, to refine the approximation with each step. Such an iterative process may involve the SAR ULP ADC sampling its input voltage, such as analog voltage signal 1810, comparing it with the DAC output 1910, and updating its digital value output based on the comparison until a final 8-bit binary representation of its input voltage is obtained and output.

Figure 20:
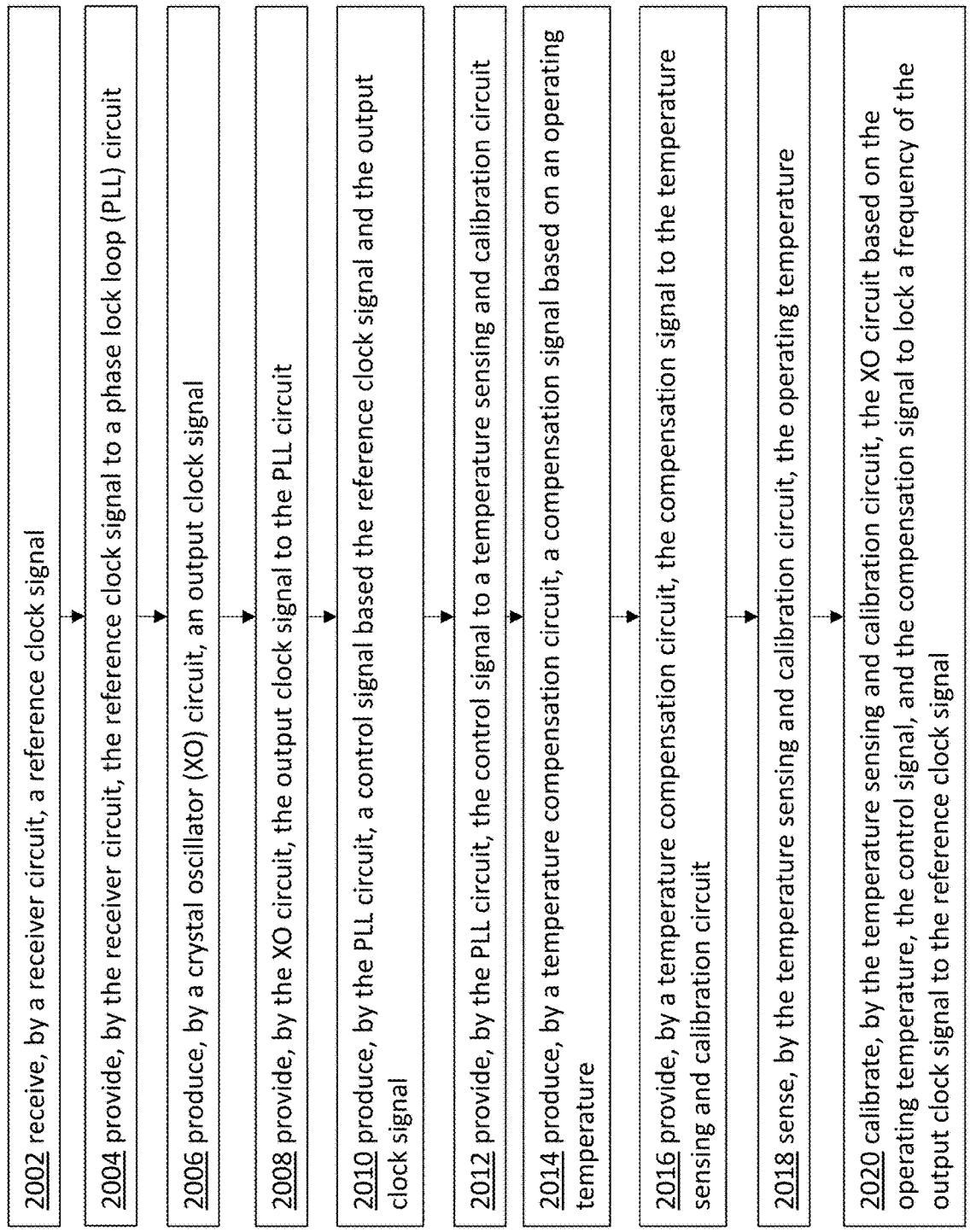
FIG. 20 is a flow chart depicting a method for circuit timing according to various embodiments of the present disclosure.

A method for circuit timing is presented herein. FIG. 20 is a flow chart depicting a method for circuit timing. At 2002, a reference clock signal is received by a receiver circuit. At 2004, the reference clock signal to a phase lock loop (PLL) circuit is provided by the receiver circuit. At 2006, an output clock signal is produced by a crystal oscillator (XO). At 2008, the output clock signal is provided by the XO circuit to the PLL circuit. At 2010, a control signal based on the reference clock signal and the output clock signal is produced by the PLL circuit. At 2012, the control signal is provided by the PLL circuit to a temperature sensing and calibration circuit. At 2014, a compensation signal based on an operating temperature is produced by a temperature compensation circuit. At 2016, the compensation signal is provided by the temperature compensation circuit to the temperature sensing and calibration circuit. At 2018, the operating temperature is sense by the temperature sensing and calibration circuit. At 2020, the XO circuit is calibrated by the temperature sensing and calibration circuit based on the operating temperature, the control signal, and the compensation signal to lock a frequency of the output lock signal to the reference clock signal. The PLL circuit can be electrically connected between the receiver circuit and to the XO circuit. The temperature sensing and calibration circuit can be electrically connected to the PLL circuit and the XO circuit. The temperature compensation circuit can be electrically connected to the temperature sensing and calibration circuit.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the disclosed subject matter is described herein in terms of certain preferred embodiments, those skilled in the art will recognize that various modifications and improvements may be made to the disclosed subject matter without departing from the scope thereof. Moreover, although individual features of one embodiment of the disclosed subject matter may be discussed herein or shown in the drawings of the one embodiment and not in other embodiments, it should be apparent that individual features of one embodiment may be combined with one or more features of another embodiment or features from a plurality of embodiments.

In addition to the specific embodiments claimed below, the disclosed subject matter is also directed to other embodiments having any other possible combination of the dependent features claimed below and those disclosed above. As such, the particular features presented in the dependent claims and disclosed above can be combined with each other in other manners within the scope of the disclosed subject matter such that the disclosed subject matter should be recognized as also specifically directed to other embodiments having any other possible combinations. Thus, the foregoing description of specific embodiments of the disclosed subject matter has been presented for purposes of illustration and description. It is not intended to be exhaustive or to limit the disclosed subject matter to those embodiments disclosed.

It will be apparent to those skilled in the art that various modifications and variations can be made in the method and system of the disclosed subject matter without departing from the spirit or scope of the disclosed subject matter. Thus, it is intended that the disclosed subject matter include modifications and variations that are within the scope of the appended claims and their equivalents.

Having thus described several illustrative embodiments, it is to be appreciated that various alterations, modifications, and improvements will readily occur to those skilled in the art. Such alterations, modifications, and improvements are intended to form a part of this disclosure, and are intended to be within the spirit and scope of this disclosure. While some examples presented herein involve specific combinations of functions or structural elements, it should be understood that those functions and elements may be combined in other ways according to the present disclosure to accomplish the same or different objectives. In particular, acts, elements, and features discussed in connection with one embodiment are not intended to be excluded from similar or other roles in other embodiments. Additionally, elements and components described herein may be further divided into additional components or joined together to form fewer components for performing the same functions. Accordingly, the foregoing description and attached drawings are by way of example only, and are not intended to be limiting.

What is claimed is:

1. An ultra-low power (ULP) timing circuit system, the system comprising:
a receiver circuit;
a phase lock loop (PLL) circuit;
a crystal oscillator (XO) circuit;
a temperature sensing and calibration circuit; and
a temperature compensation circuit;
wherein the PLL circuit is electrically coupled between the receiver circuit and the XO circuit, the temperature sensing and calibration circuit is electrically coupled to the PLL circuit and the XO circuit, and the temperature compensation circuit is electrically coupled to the temperature sensing and calibration circuit; wherein:
the receiver circuit is configured to receive a reference clock signal, and to provide the reference clock signal to the PLL circuit;
the XO circuit is configured to produce an output clock signal, and to provide the output clock signal to the PLL circuit;
the PLL circuit is configured to produce a control signal based on the reference clock signal and the output clock signal, and to provide the control signal to the temperature sensing and calibration circuit;
the temperature compensation circuit is configured to produce a compensation signal based on an operating temperature, and to provide the compensation signal to the temperature sensing and calibration circuit; and
the temperature sensing and calibration circuit is configured to sense the operating temperature and to calibrate the XO circuit based on the operating temperature, the control signal, and the compensation signal to lock a frequency of the output clock signal to the reference clock signal.

2. The system of claim 1, wherein the receiver circuit comprises a GPS receiver circuit and an antenna.

3. The system of claim 1, wherein the PLL circuit comprises a phase frequency detector, wherein the phase frequency detector is configured to:
compare the reference clock signal and the output clock signal;
produce the control signal based on the comparison of the reference clock signal and the output clock signal; and
provide the control signal to the temperature sensing and calibration circuit.

4. The system of claim 1, wherein the XO circuit comprises an analog amplifier electrically coupled in parallel to a resistor and an XTAL, wherein the analog amplifier is biased sub-threshold.

5. The system of claim 1, wherein the XO circuit comprises analog amplifier electrically coupled to an on-chip oscillator, wherein the analog amplifier is biased sub-threshold.

6. The system of claim 1, wherein the XO circuit comprises a voltage-controlled oscillator (VCO).

7. The system of claim 6, wherein the temperature sensing and calibration circuit comprises a plurality of varactors electrically coupled to the XO circuit, the PLL circuit, and the temperature compensation circuit, wherein at least a first two of the plurality of varactors are configured to produce a first XO control signal based on the temperature compensation signal, and at least a second two of the plurality of varactors are configured to produce a second XO control signal based on the control signal.

8. The system of claim 7, wherein the XO circuit is further configured to adjust the output clock signal based on the first XO control signal and the second XO control signal.

9. The system of claim 1, wherein the temperature compensation circuit comprises a bandgap reference circuit, an analog temperature sensor, and a voltage conditioning circuit, wherein the bandgap reference circuit, the analog temperature sensor, and the voltage conditioning circuit are electrically coupled in series, and wherein the compensation signal comprises a thermal voltage.

10. The system of claim 9, wherein the analog temperature sensor comprises:
a proportional to absolute temperature (PTAT) current source, wherein the PTAT current source is configured to generate a PTAT current that varies with a temperature; and
a switched-capacitor converter electrically coupled to the PTAT current source, wherein the switched-capacitor converter is configured to generate an analog voltage signal based on the PTAT current.

11. A method for circuit timing, the method comprising:
receiving, by a receiver circuit, a reference clock signal;
providing, by the receiver circuit, the reference clock signal to a phase lock loop (PLL) circuit;
producing, by a crystal oscillator (XO) circuit, an output clock signal;
providing, by the XO circuit, the output clock signal to the PLL circuit;
producing, by the PLL circuit, a control signal based on the reference clock signal and the output clock signal;
providing, by the PLL circuit, the control signal to a temperature sensing and calibration circuit;
producing, by a temperature compensation circuit, a compensation signal based on an operating temperature;
providing, by the temperature compensation circuit, the compensation signal to the temperature sensing and calibration circuit;
sensing, by the temperature sensing and calibration circuit, the operating temperature; and
calibrating, by the temperature sensing and calibration circuit, the XO circuit based on the operating temperature, the control signal, and the compensation signal to lock a frequency of the output clock signal to the reference clock signal; wherein the PLL circuit is electrically coupled between the receiver circuit and the XO circuit, the temperature sensing and calibration circuit is electrically coupled to the PLL circuit and the XO circuit, and the temperature compensation circuit is electrically coupled to the temperature sensing and calibration circuit.

12. The method of claim 11, wherein the receiver circuit comprises a GPS receiver circuit and an antenna.

13. The method of claim 11, wherein the PLL circuit comprises a phase frequency detector, wherein the method further comprises:
comparing, by the phase frequency detector, the reference clock signal and the output clock signal;
producing, by the phase frequency detector, the control signal based on the comparison of the reference clock signal and the output clock signal; and
providing, by the phase frequency detector, the control signal to the temperature sensing and calibration circuit.

14. The method of claim 11, wherein the XO circuit comprises an analog amplifier electrically coupled in parallel to a resistor and an XTAL, wherein the analog amplifier is biased sub-threshold.

15. The method of claim 11, wherein the XO circuit comprises an analog amplifier electrically coupled to an on-chip oscillator, wherein the analog amplifier is biased sub-threshold.

16. The method of claim 11, wherein the XO circuit comprises a voltage-controlled oscillator (VCO).

17. The method of claim 16, wherein the temperature sensing and calibration circuit comprises a plurality of varactors electrically coupled to the XO circuit, the PLL circuit, and the temperature compensation circuit, wherein the method further comprises:
producing, by at least a first two of the plurality of varactors, a first XO control signal based on the temperature compensation signal; and
producing, by at least a second two of the plurality of varactors, a second XO control signal based on the control signal.

18. The method of claim 17, wherein the method further comprises:
adjusting, by the XO circuit, the output clock signal based on the first XO control signal and the second XO control signal.

19. The method of claim 11, wherein the temperature compensation circuit comprises a bandgap reference circuit, an analog temperature sensor, and a voltage conditioning circuit, wherein the bandgap reference circuit, the analog temperature sensor, and the voltage conditioning circuit are electrically coupled in series, and wherein the compensation signal comprises a thermal voltage.

20. The method of claim 19, wherein the analog temperature sensor comprises a proportional to absolute temperature (PTAT) current source and a switched-capacitor converter electrically coupled to the PTAT current source, and wherein the method further comprises:
generating, by the PTAT current source, a PTAT current that varies with a temperature; and
generating, by the switched-capacitor converter, an analog voltage signal based on the PTAT current.

* * * * *